US012805390B2

(12) United States Patent
Libsch

(10) Patent No.: US 12,805,390 B2
(45) Date of Patent: Nov. 17, 2026

(54) INTRA-BONDING SEMICONDUCTOR INTEGRATED CIRCUIT CHIPS

(71) Applicant: International Business Machines Corporation, Armonk, NY (US)

(72) Inventor: Frank Robert Libsch, White Plains, NY (US)

(73) Assignee: International Business Machines Corporation, Armonk, NY (US)

(*) Notice: Subject to any disclaimer, the term of this patent is extended or adjusted under 35 U.S.C. 154(b) by 932 days.

(21) Appl. No.: 17/958,734

(22) Filed: Oct. 3, 2022

(65) Prior Publication Data

US 2024/0113076 A1 Apr. 4, 2024

(51) Int. Cl.

| | |
|---|---|
| ***H10W 46/00*** | (2026.01) |
| ***H10W 90/00*** | (2026.01) |
| *H10W 40/22* | (2026.01) |
| *H10W 72/00* | (2026.01) |
| *H10W 72/30* | (2026.01) |
| *H10W 72/90* | (2026.01) |

(Continued)

(52) U.S. Cl.

CPC ........... *H10W 90/00* (2026.01); *H10W 46/00* (2026.01); *H10W 40/226* (2026.01); *H10W 46/301* (2026.01); *H10W 72/07236* (2026.01); *H10W 72/07354* (2026.01); *H10W 72/347* (2026.01); *H10W 72/877* (2026.01); *H10W 72/951* (2026.01); *H10W 72/952* (2026.01); *H10W 74/15* (2026.01); *H10W 80/312* (2026.01); *H10W 80/327* (2026.01); *H10W 90/724* (2026.01); *H10W 90/734* (2026.01); *H10W 90/792* (2026.01)

(58) Field of Classification Search

CPC ... H01L 25/0655; H01L 23/544; H01L 24/81; H10W 46/00; H10W 90/00

See application file for complete search history.

(56) References Cited

U.S. PATENT DOCUMENTS

| | | | |
|---|---|---|---|
| 5,250,843 | A | 10/1993 | Eichelberger |
| 6,287,949 | B1 | 9/2001 | Mori et al. |
| 6,838,312 | B2 | 1/2005 | Hikita et al. |

(Continued)

FOREIGN PATENT DOCUMENTS

| | | | |
|---|---|---|---|
| KR | 101343343 | B1 | 12/2013 |
| TW | 202232486 | A | 8/2022 |

(Continued)

*Primary Examiner* — Dale E Page
*Assistant Examiner* — Wilner Jean Baptiste
(74) *Attorney, Agent, or Firm* — Samuel Waldbaum; Ryan, Mason & Lewis, LLP

(57) ABSTRACT

Techniques are provided for intra-bonding multiple semiconductor integrated circuit chips to form multi-chip package structures. For example, a device comprises a first semiconductor die and a second semiconductor die. The first semiconductor die comprises a first overlap region which comprises a first array of metallic contacts. The second semiconductor die comprises a second overlap region which comprises a second array of metallic contacts. The first overlap region and the second overlap region are overlapped and bonded together with the first array of metallic contacts aligned to the second array of metallic contacts, and with the first semiconductor die and the second semiconductor die disposed laterally adjacent to each other.

25 Claims, 16 Drawing Sheets

(51) Int. Cl.
*H10W 74/15* (2026.01)
*H10W 80/00* (2026.01)

(56) References Cited

U.S. PATENT DOCUMENTS

| | | | | |
|---|---|---|---|---|
| 7,067,910 | B2 | 6/2006 | Drost et al. | |
| 8,258,011 | B2 | 9/2012 | Brun et al. | |
| 8,624,323 | B2 * | 1/2014 | Gates | H01L 21/02667 257/713 |
| 10,923,429 | B2 | 2/2021 | Braunisch et al. | |
| 11,043,270 | B1 * | 6/2021 | Libsch | G11C 17/143 |
| 11,476,238 | B2 * | 10/2022 | Libsch | G02B 6/4269 |
| 2003/0157782 | A1 * | 8/2003 | Kellar | H10W 20/20 257/E21.705 |
| 2014/0131854 | A1 * | 5/2014 | Hawk | H01L 24/06 257/737 |
| 2016/0189980 | A1 * | 6/2016 | Paek | H01L 21/486 438/126 |
| 2022/0262730 | A1 | 8/2022 | Liaw | |
| 2022/0357538 | A1 | 11/2022 | Chang | |

FOREIGN PATENT DOCUMENTS

| | | | |
|---|---|---|---|
| TW | 202249129 | A | 12/2022 |
| TW | 202416484 | A | 4/2024 |
| WO | 1985003806 | A1 | 8/1985 |

* cited by examiner

500

640

640

800

INTRA-BONDING SEMICONDUCTOR INTEGRATED CIRCUIT CHIPS

BACKGROUND

This disclosure generally relates to semiconductor packaging techniques and, in particular, to techniques for constructing multi-chip package structures. Innovations in semiconductor fabrication and packaging technologies have enabled the development of smaller scale, higher density semiconductor integrated circuit (IC) chips, as well as the development of highly integrated chip modules with wiring and area array input/output (I/O) contact densities that enable dense packaging of IC chips. For certain applications, high-performance electronic are constructed with one or more multi-chip modules (MCMs) mounted to a circuit board (e.g., a system board (or node card), a printed circuit board, a printed wiring board, etc.) using a suitable area array connection technique for module-to-board I/O interconnections (e.g., land grid array (LGA) or ball grid array (BGA) connections). MCM technology can be utilized to form a first level package structure with high-density packaging of multiple IC processor chips for computer server applications, or multiple heterogeneous chips for custom applications, etc.

Various conventional techniques, such as two-dimensional (2-D) packaging and three-dimensional (3-D) packaging techniques, can be utilized to construct an MCM package structure. With 2-D packaging, an MCM can be constructed by connecting multiple semiconductor IC dies directly to a package substrate using direct chip attachment (DCA) techniques (e.g., flip-chip bonding), wherein the semiconductor IC chips are mounted in the package laterally adjacent to each other (e.g., in a single plane, or coplanar to each other). In this regard, 2-D packaging techniques can require a relatively large package footprint to accommodate multiple semiconductor IC chips. In addition, the I/O communication paths between adjacent chips can be very long since chip-to-chip I/O communication is made through chip-substrate-chip connections and interfaces, which can result in noisy and long interconnect lengths, which can degrade signal integrity.

On the other hand, with 3-D packaging, two more semiconductor IC chips are vertically stacked on top of each other, and interconnected (without an intermediate layer or package substrate) using vertical interconnection structures such as through silicon via (TSV) interconnect structures. While 3-D packaging can provide improvement in communication bandwidth between the stacked chips, there are various problematic issues associated with 3-D packaging.

For example, current chip stacking processes are mainly based on TSV technology, wherein the bottom most chip and intermediate chips in the 3-D packaging require TSV structures to enable I/O communication between the chips and to the package substrate, as well as delivery of ground and power connections from the package substrate to each of the stacked chips. In this regard, a large number of TSVs that may be needed for I/O and power delivery can consume a relatively large amount of real estate of the stacked chips (which can limit TSV density) and pose issues with regard to TSV alignment accuracy. In addition, the TSVs used for power delivery can cause voltage drop to the upper chips, requirement relatively large real estate consumption for the larger power TSVs needed in the lower chips to reduce the TSV resistance.

In addition, 3-D stacking makes it more difficult to cool the bottom most chips due to longer and warmer paths for thermal conduction from the lower and intermediate chips to an upper package lid and heat sink which are thermally coupled to the uppermost chip in the 3-D stack. Other issues associated with 3-D packaging include, but are not limited to, (i) delays caused by parasitic capacitances of the 3-D wiring which has much higher parasitic capacitance as compared to conventional in-die wires, (ii) stack assembly yield and/or requiring more chip real estate for yield loss mitigation through, for example, redundancy, (iii) requirements for extra chip processing such as backside thinning to keep the stacked chips as thin as possible as well as extra fabrication specific steps for TSVs, (iv) a chip stacking limit, etc.

SUMMARY

Embodiments of the disclosure include multi-chip package structures and techniques for intra-bonding multiple semiconductor integrated circuit chips (or semiconductor dies) to form multi-chip package structures. For example, an exemplary embodiment includes a device which comprises a first semiconductor die and a second semiconductor die. The first semiconductor die comprises a first overlap region which comprises a first array of metallic contacts. The second semiconductor die comprises a second overlap region which comprises a second array of metallic contacts. The first overlap region and the second overlap region are overlapped and bonded together with the first array of metallic contacts aligned to the second array of metallic contacts, and with the first semiconductor die and the second semiconductor die disposed laterally adjacent to each other.

Advantageously, the overlapping and bonding of the first overlap region and the second overlap region of the first semiconductor die and the second semiconductor die, with the first array of metallic contacts aligned to the second array of metallic contacts, provides direct die-to-die connections in the overlapping, and intra-bonded regions of the first and second semiconductor dies without the need to route die-to-die connections through an underlying package substrate. Further, such direct die-to-die connections provide short, low resistance and low capacitance connections between the first and second integrated circuit dies. Further, the bonding of the first and second overlap regions of the first and second semiconductor dies results in a reduced package footprint, as compared to a standard 2-D package structure in which the first and second semiconductor dies would be mounted separately on a package substrate. Moreover, the intra-bonding of the first and second overlap regions of the first and semiconductor dies allows for high-density integration without the disadvantages associated with 3-D packaging as discussed above.

Another exemplary embodiment includes a device which comprises a first semiconductor die and a second semiconductor die. The first semiconductor die comprises a first overlap region which comprises a first array of metallic contacts. The second semiconductor die comprises a second array of metallic contacts. The second semiconductor die is bonded to the first overlap region of the first semiconductor die with the second array of metallic contacts aligned to at least a portion of the first array of metallic contacts, and with the first semiconductor die and the second semiconductor die disposed laterally adjacent to each other.

Another exemplary embodiment includes an apparatus which comprises a package substrate, and a multi-chip package structure mounted on the package substrate. The multi-chip package structure comprises a first semiconductor die and a second semiconductor die. The first semiconductor die comprises a first overlap region which comprises a first array of metallic contacts. The second semiconductor die comprises a second overlap region which comprises a second array of metallic contacts. The first overlap region and the second overlap region are overlapped and bonded together with the first array of metallic contacts aligned to the second array of metallic contacts, and with the first semiconductor die and the second semiconductor die disposed laterally adjacent to each other.

Another exemplary embodiment includes an apparatus which comprises a package substrate, a multi-chip package structure mounted on the package substrate. The multi-chip package structure comprises a first semiconductor die and a second semiconductor die. The first semiconductor die comprises a first overlap region which comprises a first array of metallic contacts. The second semiconductor die comprises a second array of metallic contacts. The second semiconductor die is bonded to the first overlap region of the first semiconductor die with the second array of metallic contacts aligned to at least a portion of the first array of metallic contacts, and with the first semiconductor die and the second semiconductor die disposed laterally adjacent to each other.

In another exemplary embodiment, as may be combined with the proceeding paragraphs, the first array of metallic contacts comprises a first array of copper posts disposed in a first insulting layer, and the second array of metallic contacts comprises a second array of copper posts disposed in a second insulating layer.

In another exemplary embodiment, as may be combined with the proceeding paragraphs, the first overlap region and the second overlap region are bonded together by at least one of: thermal compression bonding of the first array of copper posts and the second array of copper posts; and covalent bonding of the first insulting layer and the second insulating layer.

Another exemplary embodiment includes a method which comprises: forming a first semiconductor die on a first semiconductor wafer, wherein the first semiconductor die comprises a first overlap region which comprises a first array of metallic contacts; forming a second semiconductor die on a second semiconductor wafer, wherein the second semiconductor die comprises a second overlap region which comprises a second array of metallic contacts; transferring the first semiconductor die from the first semiconductor wafer to a handler substrate; transferring the second semiconductor die from the second semiconductor wafer to the handler substrate, wherein transferring the second semiconductor die to the handler substrate comprises overlapping the second overlap region with the first overlap region and aligning the second array of metallic contacts with the first array of metallic contacts; and bonding the first overlap region and the second overlap region with the first array of metallic contacts and the second array of metallic contacts aligned, and with the first semiconductor die and the second semiconductor die disposed laterally adjacent to each other on the handler substrate.

Other embodiments of the disclosure will be described in the following detailed description of embodiments, which is to be read in conjunction with the accompanying figures.

BRIEF DESCRIPTION OF THE DRAWINGS

FIGS. 1A and 1B schematically illustrate a multi-chip package structure comprising intra-bonded semiconductor integrated circuit chips, according to an exemplary embodiment of the disclosure, wherein FIG. 1A is a top plan view of the multi-chip package structure, and FIG. 1B is a schematic cross-sectional side view of the multi-chip package structure along line 1B-1B in FIG. 1A.

FIGS. 2A and 2B schematically illustrate a multi-chip package structure comprising intra-bonded semiconductor integrated circuit chips, according to another exemplary embodiment of the disclosure, wherein FIG. 2A is a top plan view of the multi-chip package structure, and FIG. 2B is a schematic cross-sectional side view of the multi-chip package structure along line 2B-2B in FIG. 2A.

FIGS. 3A and 3B schematically illustrate a multi-chip package structure comprising intra-bonded semiconductor integrated circuit chips, according to another exemplary embodiment of the disclosure, wherein FIG. 3A is a top plan view of the multi-chip package structure, and FIG. 3B is a schematic cross-sectional side view of the multi-chip package structure along line 3B-3B in FIG. 3A.

FIGS. 4A and 4B schematically illustrate a multi-chip package structure comprising intra-bonded semiconductor integrated circuit chips, according to another exemplary embodiment of the disclosure, wherein FIG. 4A is a top plan view of the multi-chip package structure, and FIG. 4B is a schematic cross-sectional side view of the multi-chip package structure along line 4B-4B in FIG. 4A.

FIGS. 5A, 5B, 5C, 5D, and 5E schematically illustrate a process for fabricating a multi-chip package structure, according to an embodiment of the disclosure, wherein:

FIG. 5A illustrates schematic cross-sectional side views of a first semiconductor wafer and a second semiconductor wafer at an initial stage of fabrication in which active device layers are formed on the frontside of the first and second semiconductor wafers;

FIG. 5B schematic illustrates cross-sectional side views of the first and second semiconductor wafers after forming etch stop layers with embedded arrays of metallic contacts;

FIG. 5C schematically illustrates cross-sectional side views of the first and second semiconductor wafers after forming back-end-of-line structures on the frontsides of the first and second semiconductor wafers; and FIG. 5D schematically illustrates cross-sectional side views of the first and second semiconductor wafers after performing an etch process to expose the arrays of metallic contacts of first and second semiconductor integrated circuit chips of the first and second semiconductor wafers;

FIG. 5E schematically illustrates a cross-sectional side view of a multi-chip package structure that is formed by intra-bonding the first and second semiconductor integrated circuit chips after removal from the first and second semiconductor wafers.

DETAILED DESCRIPTION

Figure 1A:
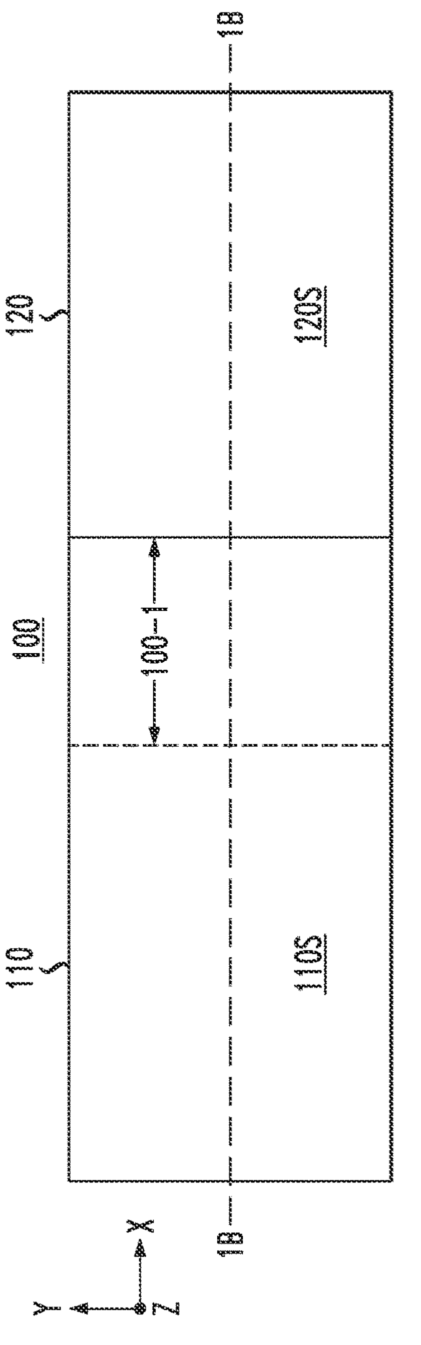

Embodiments of the disclosure will now be discussed in further detail with regard to multi-chip package structures and techniques for intra-bonding multiple semiconductor integrated circuit chips to form multi-chip package structures. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. The term "exemplary" as used herein means "serving as an example, instance, or illustration". Any embodiment or design described herein as "exemplary" is not to be construed as preferred or advantageous over other embodiments or designs. The word "over" as used herein to describe forming a feature (e.g., a layer) "over" a side or surface, means that the feature (e.g., the layer) may be formed "directly on" (i.e., in direct contact with) the implied side or surface, or that the feature (e.g., the layer) may be formed "indirectly on" the implied side or surface with one or more additional layers disposed between the feature (e.g., the layer) and the implied side or surface.

Further, the term "semiconductor integrated circuit chip" as used herein refers to a semiconductor die which comprises an integrated circuit, which is fabricated on a semiconductor wafer comprising multiple dies, and which can be diced (cut) from a semiconductor wafer using a die singulation process to provide a singulated die for packaging. In the context of semiconductor integrated circuits, a die is a block of semiconductor material on which a given functional circuit is fabricated (e.g., memory circuit, processor circuitry, etc.). The terms "chip" and "die" are used interchangeably herein.

To provide spatial context to the different structural orientations of the semiconductor structures shown in the drawings, XYZ Cartesian coordinates are shown in the drawings. The terms "vertical" or "vertical direction" or "vertical height" as used herein denote a Z-direction of the Cartesian coordinates shown in the drawings, and the terms "horizontal," "horizontal direction," "lateral," or "lateral direction" as used herein denote an X-direction and/or a Y-direction of the Cartesian coordinates shown in the drawings.

Figure 1B:
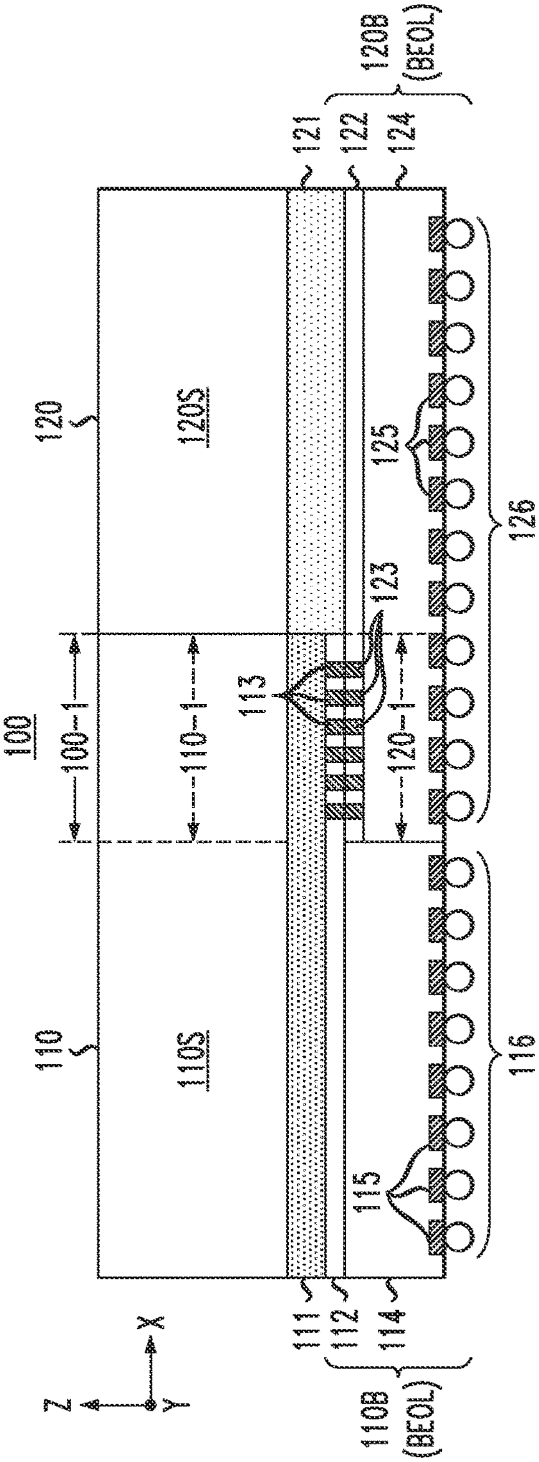

FIGS. 1A and 1B schematically illustrate a multi-chip package structure 100 comprising intra-bonded semiconductor integrated circuit chips, according to an exemplary embodiment of the disclosure. FIG. 1A is a top plan view of the multi-chip package structure 100, and FIG. 1B is a schematic cross-sectional side view of the multi-chip package structure 100 along line 1B-1B in FIG. 1A. As collectively shown in FIGS. 1A and 1B, the multi-chip package structure 100 comprises a first semiconductor integrated circuit (IC) chip 110 (or first semiconductor die), and a second semiconductor IC chip 120 (or second semiconductor die), which are intra-bonded through back-end-of-line (BEOL) connections. The first semiconductor IC chip 110 comprises a base semiconductor substrate 110S, a FEOL (front-end-of-line)/MOL (middle-of-line) structure 111 (which is formed on a frontside of the base semiconductor substrate 110S), and a BEOL structure 110B comprising an etch stop layer 112, an array of metallic contacts 113 (e.g., metallic posts) embedded in the etch stop layer 112, multiple wiring levels 114, and an array of contact pads 115 and solder balls 116 (e.g., C4 solder balls) disposed on the contact pads 115. In some embodiments, the array of contact pads 115 are patterned from a last metallization level of the BEOL structure 110B.

The second semiconductor IC chip 120 comprises a base semiconductor substrate 120S, a FEOL/MOL structure 121 (which is formed on a frontside of the base semiconductor substrate 120S), and a BEOL structure 120B comprising an etch stop layer 122, an array of metallic contacts 123 (e.g., metallic posts) embedded in the etch stop layer 122, multiple wiring levels 124, and an array of contact pads 125 and solder balls 126 (e.g., controlled collapse chip connection (C4) solder balls) disposed on the contact pads 125. In some embodiments, the array of contact pads 125 are patterned from a last metallization level of the BEOL structure 120B.

As schematically illustrated in FIG. 1B, the first and second semiconductor IC chips 110 and 120 are disposed laterally adjacent to each other (e.g., coplanar) and bonded together in an overlapping region 100-1 in which an overlap region 110-1 of the first semiconductor IC chip 110 (which comprises the array of metallic contacts 113), and an overlap region 120-1 of the second semiconductor IC chip 120 (which comprises the array of metallic contacts 123) are aligned and bonded together to provide a high-density array of chip-to-chip interconnections through bonding of the array of metallic contacts 113 and the array of metallic contacts 123.

In some embodiments, as shown in FIG. 1B, the overlap region 110-1 of the first semiconductor IC chip 110 is formed by patterning and etching the BEOL structure 110B down to the etch stop layer 112 to expose the array of metallic contacts 113 which are formed as part of the first metallization level of the BEOL structure 110B. On the other hand, the overlap region 120-1 of the second semiconductor IC chip 120 is formed by backside patterning and etching the base semiconductor substrate 120S (and FEOL/MOL layer) down to the etch stop layer 122 to expose the array of metallic contacts 123 which are formed as part of the first metallization level of the BEOL structure 120B. During fabrication, the overlapping portions 110-1 and 120-1 of the respective first and second semiconductor IC chips 110 and 120 are disposed in alignment such that the array of metallic contacts 113 are aligned with the array of metallic contacts 123 and then bonded using techniques as discussed below.

The high-density array of chip-to-chip interconnections, which is formed by bonding the array of metallic contacts 113 and the array of metallic contacts 123, provides direct I/O connections between the first and second semiconductor IC chips 110 and 120 without the need to route I/O communication between the first and second semiconductor IC chips 110 and 120 through, e.g., high-density bridge chip or through a package substrate, as in conventional packaging structures and techniques. Another advantage of the intra-chip I/O bonding is that smaller I/O metal contact pitch can be obtained due to the smaller ground rules and better lithographic alignment provided by state-of-the-art semiconductor integrated circuit fabrication processes, as compared to conventional larger off-chip (i.e., inter-chip) I/O package level bonding (i.e., C4 solder interconnects). In FIG. 1B, the array of metallic contacts 113 are connected to active/passive components in the FEOL/MOL structure 111 of the first semiconductor integrated circuit chip 110, and the array of metallic contacts 123 are connected to active/passive components in the FEOL/MOL structure 121 of the second semiconductor integrated circuit chip 120 through lateral/vertical wiring in the wiring levels 124 of the BEOL structure 120B of the second semiconductor integrated circuit chip 120. In some embodiments, the array of metallic contacts 113 and the array of metallic contacts 123 are formed with a relatively small contact pitch, e.g., 75 microns or smaller or more preferably, 55 microns or less, depending on the application. In addition, the array of metallic contacts 113 and the array of metallic contacts 123 can be formed with micron or submicron dimensions consistent with state-of-the-art microfabrication and bonding alignment ground rules.

As shown in FIG. 1B, the array of C4 solder balls 116 and the array of C4 solder balls 126 can be utilized to bond the first and second semiconductor IC chips 110 and 120 to a first level package substrate to provide chip-to-substrate connections that provide power connections (supply power and ground) to the first and second semiconductor IC chips 110 and 120, as well as I/O communication with other semiconductor IC chips that are mounted to the first level package substrate, etc. In some embodiments, the arrays of solder balls 116 and 126 have a contact pitch of about 40 microns or greater, depending on the application.

For a heterogeneous packaging application, the first and second semiconductor IC chips 110 and 120 may comprise various types of integrated circuits and systems to implement a given application. For example, the first and second semiconductor IC chips 110 and 120 may comprise different types of IC chips, depending on the application. In some embodiments, the first and second semiconductor IC chips 110 and 120 may comprise any one of a memory device (e.g., high-bandwidth memory (HBM), dynamic random-access memory (DRAM) device), a hardware accelerator device, a switch or controller chip, and/or a multi-core processor device, e.g., central processing unit (CPU), a microcontroller, an application-specific integrated circuit (ASIC), a field programmable gate array (FPGA), and other types of general purposes processors or work-load optimized processors such as graphics processing units (GPUs), digital signal processors (DSPs), system-on-chip (SoC), and other types of specialized processors or coprocessors that are configured to execute one or more fixed functions.

Figure 2A:
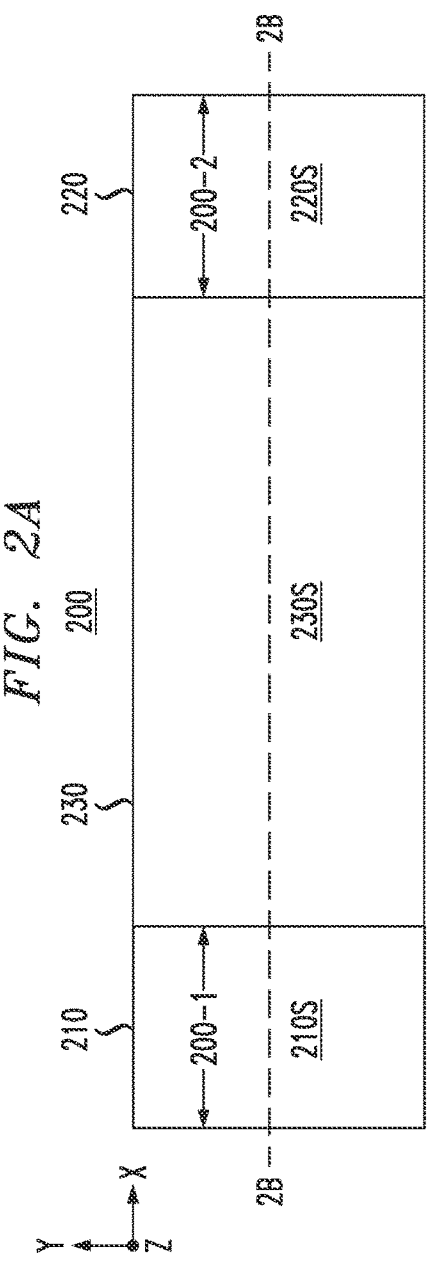
Figure 2B:
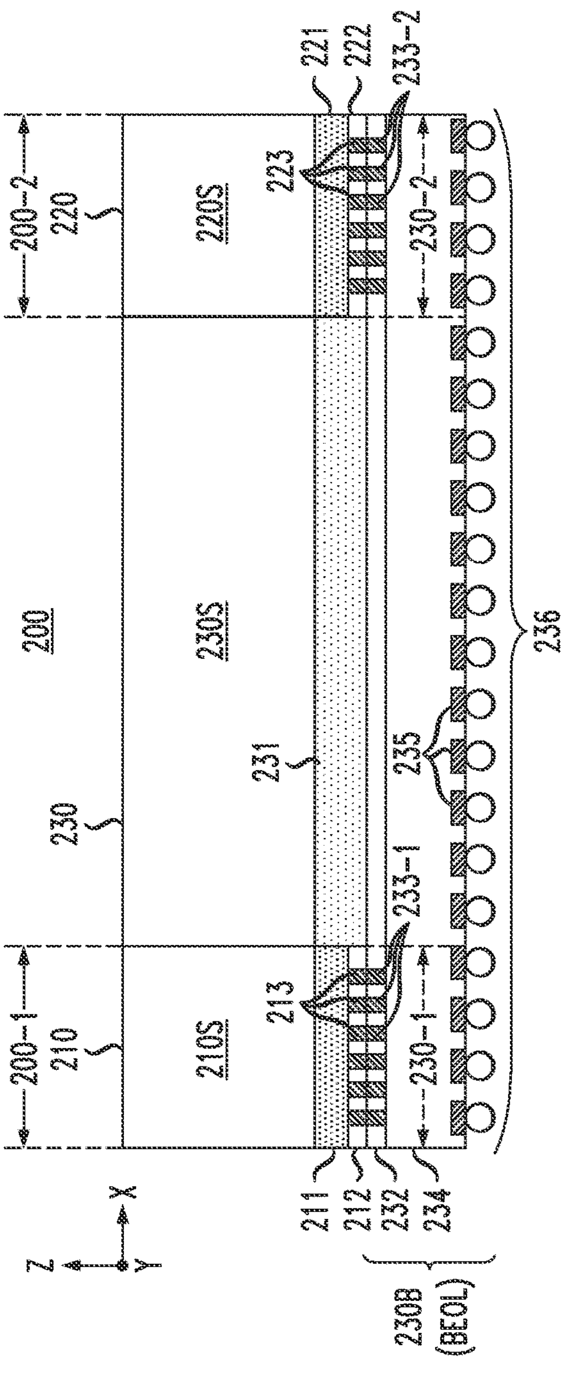

FIGS. 2A and 2B schematically illustrate a multi-chip package structure 200 comprising intra-bonded semiconductor integrated circuit chips, according to another embodiment of the disclosure. FIG. 2A is a top plan view of the multi-chip package structure 200, and FIG. 2B is a schematic cross-sectional side view of the multi-chip package structure 200 along line 2B-2B in FIG. 2A. As collectively shown in FIGS. 2A and 2B, the multi-chip package structure 200 comprises a first semiconductor IC chip 210 (or first semiconductor die), a second semiconductor IC chip 220 (or second semiconductor die), and a third semiconductor IC chip 230, which are intra-bonded through BEOL connections. As specifically shown in FIG. 2B, the first semiconductor IC chip 210 comprises a base semiconductor substrate 210S, a FEOL/MOL structure 211 (which is formed on a frontside of the base semiconductor substrate 210S), and a BEOL structure comprising an etch stop layer 212 and an array of metallic contacts 213 (e.g., metallic posts) embedded in the etch stop layer 212. Similarly, the second semiconductor IC chip 220 comprises a base semiconductor substrate 220S, a FEOL/MOL structure 221 (which is formed on a frontside of the base semiconductor substrate 220S), and a BEOL structure comprising an etch stop layer 222 and an array of metallic contacts 223 (e.g., metallic posts) embedded in the etch stop layer 222.

The third semiconductor IC chip 230 comprises a base semiconductor substrate 230S, a FEOL/MOL structure 231 (which is formed on a frontside of the base semiconductor substrate 230S), and a BEOL structure 230B comprising an etch stop layer 232, a first array of metallic contacts 233-1 (e.g., metallic posts) and a second array of metallic contacts 233-2 (e.g., metallic posts) embedded in the etch stop layer 232, multiple wiring levels 234, and an array of contact pads 235 and solder balls 236 (e.g., C4 solder balls) disposed on the contact pads 235. In some embodiments, the array of contact pads 235 are patterned from a last metallization level of the BEOL structure 230B, and the first array of metallic contacts 233-1 and the second array of metallic contacts 233-2 are patterned from a first metallization level of the BEOL structure 230B.

As schematically illustrated in FIG. 2B, the first and third semiconductor IC chips 210 and 230 are disposed laterally adjacent to each other (e.g., coplanar) and bonded together in a first overlapping region 200-1. In addition, the second and third semiconductor IC chips 220 and 230 are disposed laterally adjacent to each other (e.g., coplanar) and bonded together in second overlapping region 200-2. More specifically, the third semiconductor IC chip 230 comprises a first overlap region 230-1 and a second overlap region 230-2. The first and second overlap regions 230-1 and 230-2 are formed by backside patterning and etching different regions of the base semiconductor substrate 230S (and FEOL/MOL structure 231) of the third semiconductor IC chip 230 down to the etch stop layer 232 to expose the first array of metallic contacts 233-1 and the second array of metallic contacts 233-2.

In the first overlapping region 200-1, the first semiconductor IC chip 210 has a footprint that is the same (or substantially the same) as a footprint of the first overlap region 230-1 of the third semiconductor IC chip 230 such that an entirety of the first semiconductor integrated circuit chip 210 overlaps the first overlap region 230-1 of the third semiconductor IC chip 230. The array of metallic contacts 213 of the first semiconductor IC chip 210 are aligned with, and bonded to, corresponding contacts of the first array of metallic contacts 233-1 within the first overlap region 230-1 of the third semiconductor IC chip 230. Similarly, in the second overlapping region 200-2, the second semiconductor IC chip 220 has a footprint that is the same (or substantially the same) as a footprint of the second overlap region 230-2 of the third semiconductor IC chip 230 such that an entirety of the second semiconductor integrated circuit chip 220 overlaps the second overlap region 230-2 of the third semiconductor IC chip 230. The array of metallic contacts 223 of the second semiconductor IC chip 220 are aligned with, and bonded to, corresponding contacts of the second array of metallic contacts 233-2 within the second overlap region 230-2 of the third semiconductor IC chip 230.

FIGS. 2A and 2B schematically illustrate an exemplary multi-chip package structure in which the first and second semiconductor IC chips 210 and 220 are relatively small, as compared to the third semiconductor IC chip 230. For example, the first and second semiconductor IC chips 210 and 220 can be memory chips (e.g., HBM DRAM chips), while the third semiconductor IC chip 230 can be, e.g., a hardware processor chip or a hardware accelerator chip, etc. The first and third semiconductor IC chips 210 and 230 communicate through a high-density array of chip-to-chip interconnections (direct I/O connections) formed by bonding the array of metallic contacts 213 and the first array of metallic contacts 233-1. The second and third semiconductor IC chips 220 and 230 communicate through a high-density array of chip-to-chip interconnections (direct I/O connections) formed by bonding the array of metallic contacts 223 and the second array of metallic contacts 233-2.

In the exemplary multi-chip package structure 200, there are no direct chip-to-substrate connections from the first and second semiconductor IC chips 210 and 220 to a package substrate (not shown). Instead, all chip-to-substrate connections between the package substrate and the first and second semiconductor IC chips 210 and 220 are provided through the BEOL structure 230B of the third semiconductor IC chip 230. In such a configuration, the BEOL structure 230B of the third semiconductor IC chip 230 can have lateral and vertical wiring to route power/ground connections and other I/O connections from the package substrate to the first semiconductor IC chip 210 using a portion of the high-density interconnections formed by the intra-bonded arrays of metallic contacts 213 and 233-1 between the first and third semiconductor IC chips 210 and 230. Similarly, the BEOL structure 230B of the third semiconductor IC chip 230 can have lateral and vertical wiring to route power/ground connections and other I/O connections from the package substrate to the second semiconductor IC chip 220 using a portion of the high-density interconnections formed by the intra-bonded arrays of metallic contacts 223 and 233-2 between the second and third semiconductor IC chips 220 and 230.

Figure 3A:
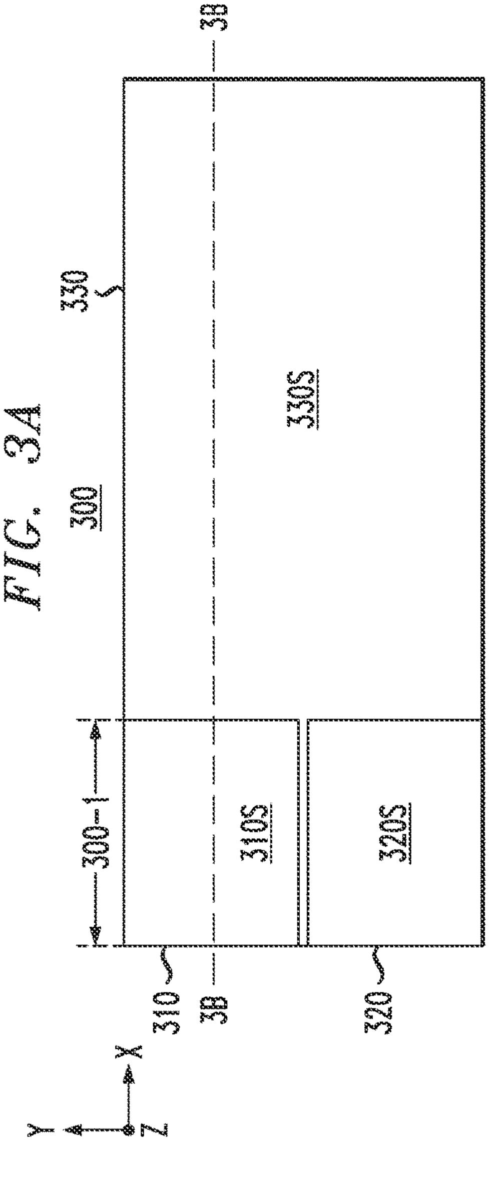
Figure 3B:
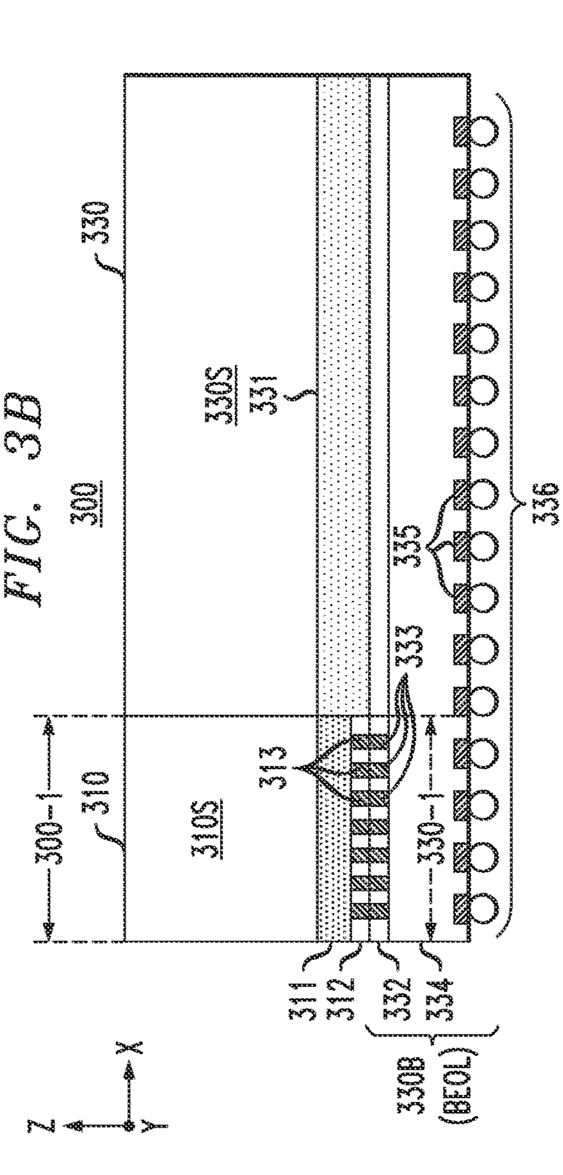

FIGS. 3A and 3B schematically illustrate a multi-chip package structure 300 comprising intra-bonded semiconductor integrated circuit chips, according to another embodiment of the disclosure. FIG. 3A is a top plan view of the multi-chip package structure 300, and FIG. 3B is a schematic cross-sectional side view of the multi-chip package structure 300 along line 3B-3B in FIG. 3A. As collectively shown in FIGS. 3A and 3B, the multi-chip package structure 300 comprises a first semiconductor IC chip 310 (or first semiconductor die), a second semiconductor IC chip 320 (or second semiconductor die), and a third semiconductor IC chip 330, which are intra-bonded through BEOL connections. As specifically shown in FIG. 3B, the first semiconductor IC chip 310 comprises a base semiconductor substrate 310S, a FEOL/MOL structure 311 (which is formed on a frontside of the base semiconductor substrate 310S), and a BEOL structure comprising an etch stop layer 312 and an array of metallic contacts 313 (e.g., metallic posts) embedded in the etch stop layer 312. While not specifically shown in FIG. 3B, the second semiconductor IC chip 320 comprises a base semiconductor substrate 320S, a FEOL/MOL structure (which is formed on a frontside of the base semiconductor substrate 320S), and a BEOL structure comprising an etch stop layer and an array of metallic contacts (e.g., metallic posts) embedded in the etch stop layer, similar to the structural configuration of the first semiconductor IC chip 310.

The third semiconductor IC chip 330 comprises a base semiconductor substrate 330S, a FEOL/MOL structure 331 (which is formed on a frontside of the base semiconductor substrate 330S), and a BEOL structure 330B comprising an etch stop layer 332, an array of metallic contacts 333 embedded in the etch stop layer 332, multiple wiring levels 334, and an array of contact pads 335 and solder balls 336 (e.g., C4 solder balls) disposed on the contact pads 335. In some embodiments, the array of contact pads 335 are patterned from a last metallization level of the BEOL structure 330B, and the array of metallic contacts 333 is patterned from a first metallization level of the BEOL structure 330B.

As schematically illustrated in FIG. 3B, the first and third semiconductor IC chips 310 and 330 are disposed laterally adjacent to each other (e.g., coplanar) and bonded together in an overlapping region 300-1. In addition, the second and third semiconductor IC chips 320 and 330 are disposed laterally adjacent to each other (e.g., coplanar) and bonded together in the overlapping region 300-1. More specifically, the third semiconductor IC chip 330 comprises an overlap region 330-1 that is formed by backside patterning and etching a region of the base semiconductor substrate 330S (and the FEOL/MOL structure 331) of the third semiconductor IC chip 330 down to the etch stop layer 332 to expose the array of metallic contacts 333.

In the overlapping region 300-1, the first and second semiconductor IC chips 310 and 320 each have a respective footprint that is smaller than a footprint of the overlap region 330-1 of the third semiconductor IC chip 330 such that an entirety of the first and second semiconductor integrated circuit chips 310 and 320 overlap different regions of the overlap region 330-1 of the third semiconductor IC chip 330. The array of metallic contacts 313 of the first semiconductor IC chip 310 are aligned with, and bonded to, corresponding contacts of the array of metallic contacts 333 within the overlap region 330-1 of the third semiconductor IC chip 330. Similarly, the array of metallic contacts (not specifically shown) of the second semiconductor IC chip 320 are aligned with, and bonded to, corresponding contacts of the array of metallic contacts 333 within the overlap region 330-1 of the third semiconductor IC chip 330.

Similar to the exemplary embodiment of FIGS. 2A and 2B discussed above, FIGS. 3A and 3B schematically illustrate an exemplary multi-chip package structure in which the first and second semiconductor IC chips 310 and 320 are relatively small, as compared to the third semiconductor IC chip

330. For example, the first and second semiconductor IC chips 310 and 320 can be memory chips (e.g., HBM DRAM chips), while the third semiconductor IC chip 330 can be, e.g., a hardware processor chip or a hardware accelerator chip, etc. The first and third semiconductor IC chips 310 and 330 communicate through a high-density array of chip-to-chip interconnections (direct I/O connections) formed by bonding the array of metallic contacts 313 of the first semiconductor IC chip 310 to a first portion of the array of metallic contacts 333 of the third semiconductor IC chip 330. The second and third semiconductor IC chips 320 and 330 communicate through a high-density array of chip-to-chip interconnections (direct I/O connections) formed by bonding the array of metallic contacts (not shown) of the second semiconductor IC chip 320 to a second portion of the array of metallic contacts 333 of the third semiconductor IC chip 330.

Furthermore, similar to the exemplary multi-chip package structure 200 (FIGS. 2A and 2B) as discussed above, in the exemplary multi-chip package structure 300, there are no direct chip-to-substrate connections from the first and second semiconductor IC chips 310 and 320 to a package substrate. Instead, all chip-to-substrate connections between the package substrate and the first and second semiconductor IC chips 310 and 320 are provided through the BEOL structure 330B of the third semiconductor IC chip 330.

Figure 4A:
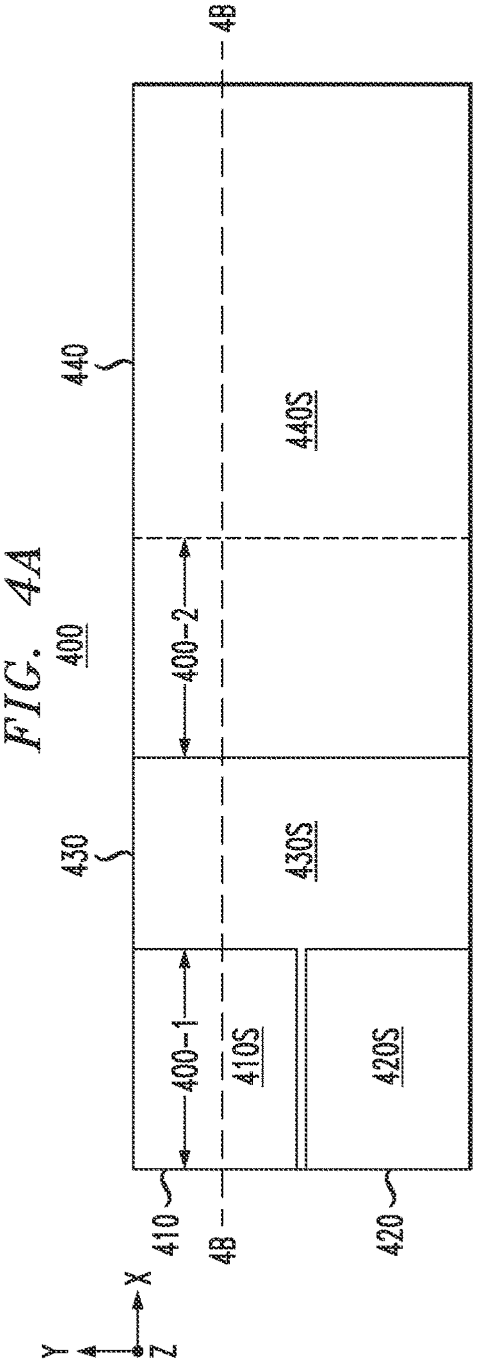
Figure 4B:
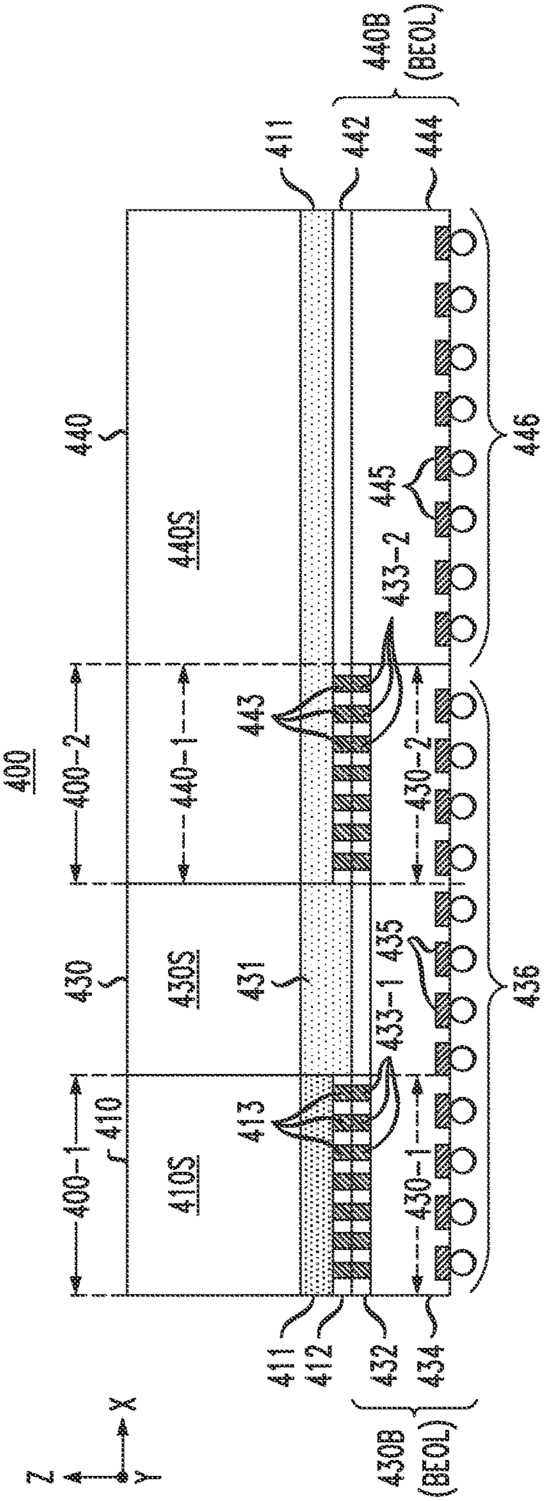

FIGS. 4A and 4B schematically illustrate a multi-chip package structure 400 comprising intra-bonded semiconductor integrated circuit chips, according to another embodiment of the disclosure. FIG. 4A is a top plan view of the multi-chip package structure 400, and FIG. 4B is a schematic cross-sectional side view of the multi-chip package structure 400 along line 4B-4B in FIG. 4A. The multi-chip package structure 400 is similar in structure to a combination of the multi-chip package structure 100 (FIGS. 1A and 1B) and the multi-chip package structure 300 (FIGS. 3A and 3B). In particular, as collectively shown in FIGS. 4A and 4B, the multi-chip package structure 400 comprises a first semiconductor IC chip 410, a second semiconductor IC chip 420, a third semiconductor IC chip 430, and a fourth semiconductor IC chip 440, which are intra-bonded through BEOL connections as shown.

As specifically shown in FIG. 4B, the first semiconductor IC chip 410 comprises a base semiconductor substrate 410S, a FEOL/MOL structure 411 (which is formed on a frontside of the base semiconductor substrate 410S), and a BEOL structure comprising an etch stop layer 412 and an array of metallic contacts 413 (e.g., metallic posts) embedded in the etch stop layer 412. While not specifically shown in FIG. 4B, the second semiconductor IC chip 420 comprises a base semiconductor substrate 420S, a FEOL/MOL structure (which is formed on a frontside of the base semiconductor substrate 420S), and a BEOL structure comprising an etch stop layer and an array of metallic contacts (e.g., metallic posts) embedded in the etch stop layer, similar to the structural configuration of the first semiconductor IC chip 410.

The third semiconductor IC chip 430 comprises a base semiconductor substrate 430S, a FEOL/MOL structure 431 (which is formed on a frontside of the base semiconductor substrate 430S), and a BEOL structure 430B comprising an etch stop layer 432, a first array of metallic contacts 433-1 (e.g., metallic posts) and a second array of metallic contacts 433-2 (e.g., metallic posts) embedded in the etch stop layer 432, multiple wiring levels 434, and an array of contact pads 435 and solder balls 436 (e.g., C4 solder balls) disposed on the contact pads 435. In some embodiments, the array of contact pads 435 are patterned from a last metallization level of the BEOL structure 430B, and the first and second arrays of metallic contacts 433-1 and 433-2 are patterned from a first metallization level of the BEOL structure 430B.

The fourth semiconductor IC chip 440 comprises a base semiconductor substrate 440S, a FEOL/MOL structure 441 (which is formed on a frontside of the base semiconductor substrate 440S), and a BEOL structure 440B comprising an etch stop layer 442, an array of metallic contacts 443 (e.g., metallic posts) embedded in the etch stop layer 442, multiple wiring levels 444, and an array of contact pads 445 and solder balls 446 (e.g., C4 solder balls) disposed on the contact pads 445. In some embodiments, the array of contact pads 445 are patterned from a last metallization level of the BEOL structure 440B, and the array of metallic contacts 443 are patterned from a first metallization level of the BEOL structure 440B.

As schematically illustrated in FIG. 4B, the first and third semiconductor IC chips 410 and 430 are disposed laterally adjacent to each other (e.g., coplanar) and intra-bonded together in a first overlapping region 400-1 of the multi-chip package structure 400. In addition, the second and third semiconductor IC chips 420 and 430 are disposed laterally adjacent to each other (e.g., coplanar) and intra-bonded together in the first overlapping region 400-1. Further, the third and fourth semiconductor IC chips 430 and 440 are disposed laterally adjacent to each other (e.g., coplanar) and intra-bonded together in a second overlapping region 400-2 of the multi-chip package structure 400. The third semiconductor IC chip 430 comprises a first overlap region 430-1 and a second overlap region 430-2, which are formed by backside patterning and etching different regions of the base semiconductor substrate 430S (and the FEOL/MOL structure 431) of the third semiconductor IC chip 430 down to the etch stop layer 432 to expose the first array of metallic contacts 433-1 and the second array of metallic contacts 433-2. The fourth semiconductor IC chip 440 comprises an overlap region 440-1 which is formed by patterning and etching a region frontside region of the fourth semiconductor IC chip 440 (i.e., etching a region of the BEOL structure 440B) down to the etch stop layer 442 to expose the array of metallic contacts 443 which are formed as part of the first metallization level of the BEOL structure 440B.

In the first overlapping region 400-1 of the multi-chip package structure 400, the first and second semiconductor IC chips 410 and 420 each have a respective footprint that is the smaller than a footprint of the first overlap region 430-1 of the third semiconductor IC chip 430 such that an entire footprint of each of the first and second semiconductor integrated circuit chips 410 and 420 overlaps a different region of the first overlap region 430-1 of the third semiconductor IC chip 430. The array of metallic contacts 413 of the first semiconductor IC chip 410 are aligned with, and bonded to, corresponding contacts of the first array of metallic contacts 433-1 within the first overlap region 430-1 of the third semiconductor IC chip 430. Similarly, the array of metallic contacts (not specifically shown) of the second semiconductor IC chip 420 are aligned with, and bonded to, corresponding contacts of the first array of metallic contacts 433-1 within the first overlap region 430-1 of the third semiconductor IC chip 430. In the second overlapping region 400-1, the overlap region 430-2 of the third semiconductor IC chip 430 and the overlap region 440-1 of the fourth semiconductor IC chip 440 are aligned and bonded together to provide a high-density array of chip-to-chip interconnections through bonding of the second array of metallic contacts 433-2 of the third semiconductor IC chip 430 and the array of metallic contacts 443 of the fourth semiconductor IC chip 430.

Similar to the exemplary multi-chip package structure 300 of FIGS. 3A and 3B discussed above, FIGS. 4A and 4B schematically illustrate an exemplary multi-chip package structure in which the first and second semiconductor IC chips 410 and 420 are relatively small, as compared to the third semiconductor IC chip 430. For example, the first and second semiconductor IC chips 410 and 420 can be memory chips (e.g., HBM DRAM chips), while the third semiconductor IC chip 430 can be, e.g., a hardware processor chip or a hardware accelerator chip, etc. In addition, the fourth semiconductor IC chip 430 can be a hardware processor chip or a hardware accelerator chip. Furthermore, in the exemplary multi-chip package structure 400, there are no direct chip-to-substrate connections from the first and second semiconductor IC chips 410 and 420 to a package substrate. Instead, all chip-to-substrate connections between the package substrate and the first and second semiconductor IC chips 410 and 420 are provided through the BEOL structure 430B of the third semiconductor IC chip 430.

The exemplary multi-chip package structures as schematically illustrated in, e.g., FIGS. 1A-1B, 2A-2B, 3A-3B, and 4A-4B comprise two or more intra-bonded semiconductor IC chips which are disposed "laterally adjacent" to each other (in a lateral direction) with lateral overlapping regions, which is in contrast to 3-D chip package structures in which the semiconductor IC chips are stacked "vertically adjacent" to each other (in a vertical direction). In some embodiments, two or more intra-bonded semiconductor IC chips, which are disposed laterally adjacent to each other, can be coplanar in the sense that the intra-bonded semiconductor IC chips form a planar upper surface and/or planar bottom surface. In some embodiments, two or more intra-bonded semiconductor IC chips, which are disposed laterally adjacent to each other, can form a non-planar surface. For example, a backside surface of a multi-chip package structure can be non-planar due to two or more intra-bonded semiconductor IC chips of the multi-chip package structure having different thicknesses or heights. In such cases, a non-planar backside surface can be accommodated by utilizing matching thermal cap (e.g., heat spreader or package lid) which is designed to have regions of different thicknesses that are aligned to the semiconductor IC chips with the different vertical heights or thicknesses, so that an inner (non-planar) surface of the thermal cap would be disposed close to the backside surfaces of the different thickness/height semiconductor IC chips, while an upper surface of the thermal cap would remain planar to, e.g., accommodate a planar heat sink disposed on top of the thermal cap.

Various methods for fabricating multi-chip package structures comprising two or more intra-bonded semiconductor IC chips, such as shown in FIGS. 1A/1B, 2A/2B, 3A/3B, and 4A/4B will now be discussed in further detail with reference to FIGS. 5A-5E. In particular, FIGS. 5A-5D schematically illustrate a process for fabricating a multi-chip package structure according to an embodiment of the disclosure. For purposes of illustration, FIGS. 5A-5E schematically illustrate a process for fabricating a multi-chip package structure comprising first and second semiconductor IC chips which are fabricated on separate wafers and then subsequently assembled together using intra-bonding techniques as discussed herein.

Figure 5A:
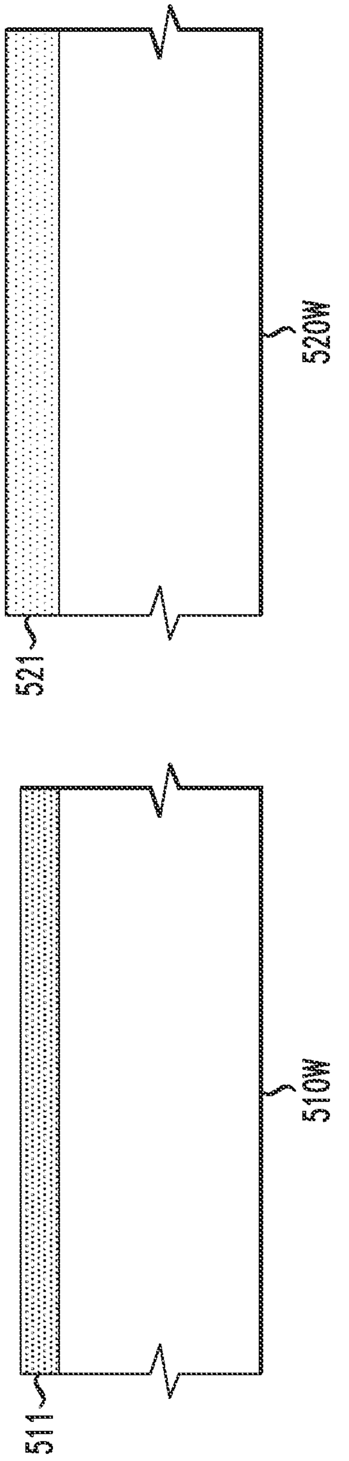

To begin, FIG. 5A illustrates schematic cross-sectional side views of a first semiconductor wafer 510W and a second semiconductor wafer 520W at an initial stage of fabrication in which a FEOL/MOL structure 511 is formed on a frontside of the first semiconductor wafer 510W, and a FEOL/MOL structure 521 is formed on a frontside of the second semiconductor wafer 520W. While the first and second semiconductor wafers 510W and 520W are illustrated as generic substrate layers, it is to be understood that the first and second semiconductor wafers 510W and 520W may comprise one of different types of semiconductor wafer structures and materials. For example, in some embodiments, the first and second semiconductor wafers 510W and 520W comprise bulk semiconductor wafers formed of silicon (Si) or germanium (Ge), or other types of semiconductor substrate materials that are commonly used in bulk semiconductor wafer fabrication processes such as a silicon-germanium alloy, compound semiconductor materials (e.g., III-V), etc. In other embodiments, the first and second semiconductor wafers 510W and 520W may comprise SOI (silicon-on-insulator) wafers, GeOI (germanium-on-insulator) wafers, or other types of semiconductor-on-insulator wafers, which comprises an insulating layer (e.g., oxide layer) disposed between a base substrate layer (e.g., silicon substrate) and the active semiconductor layer (e.g., Si, Ge, etc.) in which active circuit components are formed as part of the FEOL.

The FEOL/MOL structures 511 and 521 each comprise a FEOL layer that is formed on the frontside (active) surfaces of the respective first and second semiconductor wafers 510W and 520W. The FEOL layers comprise various semiconductor devices and components that are formed in or on the active surfaces of the first and second semiconductor wafers 510W and 520W to provide integrated circuitry for a given applications. For example, the FEOL layers comprise field-effect transistor (FET) devices (such as FinFET devices, vertical FET devices, planar FET device, etc.), bipolar transistors, diodes, capacitors, inductors, resistors, isolation devices, etc. The FEOL layers can be fabricated using state of the art FEOL processing modules. In general, FEOL processes typically include preparing the semiconductor wafers, forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structures 511 and 521 further include MOL layers formed on the FEOL layers. In general, a MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of a BEOL structure that is formed on the FEOL/MOL structures 511 and 521. In addition, the MOL layers can be formed with lateral interconnects to form connections between adjacent components.

In some embodiments, as schematically illustrated in FIG. 5A, the first and second semiconductor wafers 510W and 520W have a same thickness, while the FEOL/MOL structures 511 and 521 have slightly different thicknesses. For example, the exemplary FEOL/MOL structure 521 formed on the second semiconductor wafer 520W is thicker than the exemplary FEOL/MOL layer 511 formed on the first semiconductor wafer 510W. The different thicknesses serve to provide a sufficient height offset for properly intra-bonding singulated semiconductor IC chips that are diced from the first and second semiconductor wafers 510W and 520W during subsequent fabrication steps.

Figure 5B:
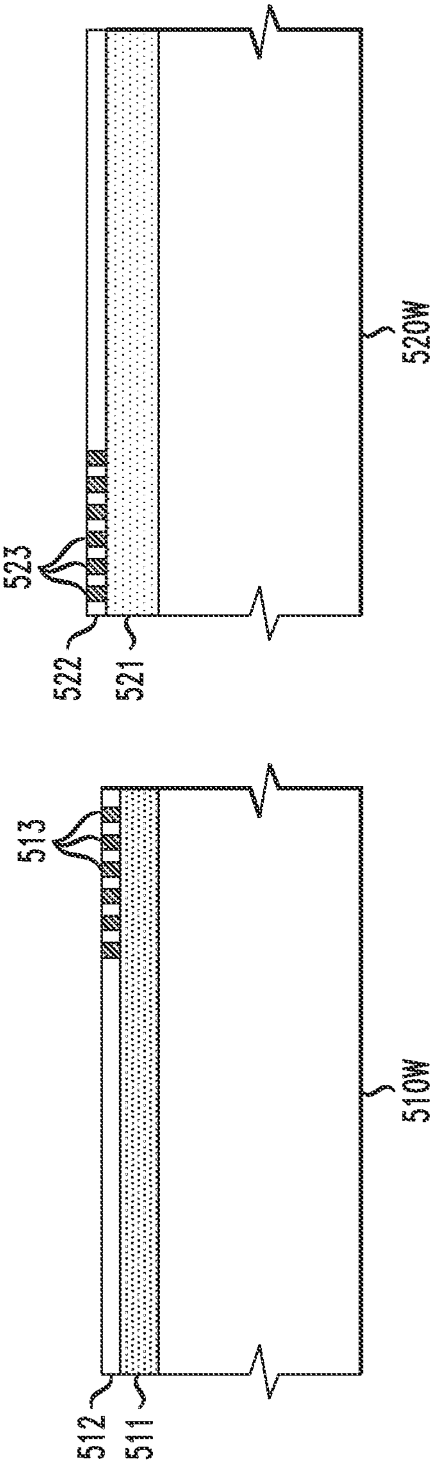

Next, FIG. 5B schematic illustrates cross-sectional side views of the first and second semiconductor wafers 510W and 520W after forming etch stop layers with embedded arrays of metallic contacts, according to an exemplary embodiment of the disclosure. In particular, as shown in FIG. 5B, an etch stop layer 512 and an array of metallic contacts 513 are formed on the FEOL/MOL structure 511 of the first semiconductor wafer 510W, and an etch stop layer 522 and an array of metallic contacts 523 are formed on the FEOL/MOL structure 521 of the second semiconductor wafer 520W. In some embodiments, the etch stop layers 512 and 522 are formed by depositing a layer of insulating material such as silicon dioxide, silicon nitride, etc., on each of the FEOL/MOL structures 511 and 521. As explained in further detail below, the etch stop layers 512 and 522 are utilized as etch termination layers during subsequent etch processes to expose the arrays of metallic contacts 513 and 523.

In some embodiments, the arrays of metallic contacts 513 and 523 are formed performing a photolithographic process to etch a pattern of openings in desired regions of the etch stop layers 512 and 522, forming a thin diffusion barrier layer to line the patterned opening, depositing a metallic material such as copper to fill the openings, and performing an etch back process (e.g., chemical mechanical polishing (CMP) process) to remove the overburden metallic material down to the upper surfaces of the etch stop layers 512 and 522. In some embodiments, the arrays of metallic contacts 513 and 523 each comprise an array of copper posts which are utilized to provide I/O interconnects between intra-bond chips in a subsequent stage of fabrication. As noted above, in some embodiments, the etch stop layers 512 and 522 and embedded arrays of metallic contacts 513 and 523 comprise first layers of BEOL structures that are formed on the FEOL/MOL structures 511 and 521. In this regard, in some embodiments, the arrays of metallic contacts 513 and 523 can be fabricated using a state-of-the-art Damascene process to form an array of copper vias in each of the etch stop layers 512 and 522 which serve as the copper post interconnects. It is to be noted that in some embodiments, a region of the FEOL/MOL structure 521 which is aligned with the array of metallic contacts 523 does not include semiconductor integrated circuit components, contact, wiring, etc., as such region will eventually be removed to expose the array of metallic contacts 523.

Figure 5C:
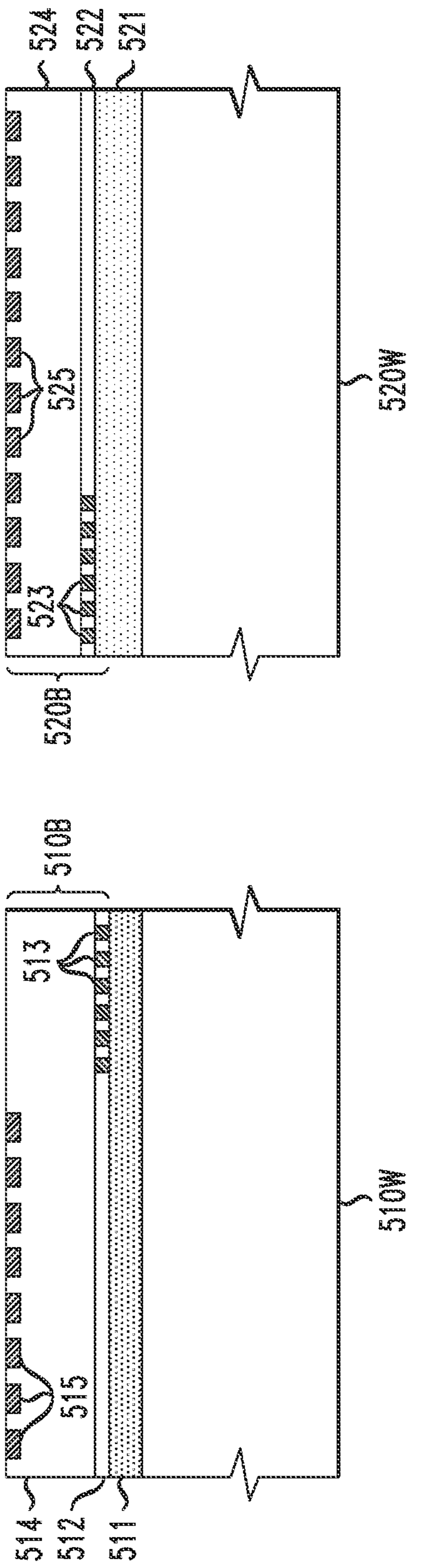

Next, FIG. 5C schematically illustrates cross-sectional side views of the first and second semiconductor wafers 510W and 520W after forming BEOL structures 510B and 520B, according to an exemplary embodiment of the disclosure. The BEOL structure 510B comprises multiple wiring layers 514 and an array of contact pads 515 which are formed as part of the last metallization level of the BEOL structure 510B. Similarly, the BEOL structure 520B comprises multiple wiring layers 524 and an array of contact pads 525 which are formed as part of the last metallization level of the BEOL structure 520B. The multiple wiring layers 514 and 524 each comprise multiple levels of metal lines and inter-level metal vias, to connect various integrated circuit components, devices, contacts, wiring, etc., that are fabricated as part of the FEOL/MOL structures 511 and 521, and to provide a power distribution network to route power/ground connections to the FEOL devices. The BEOL structures 510B and 520B are fabricated using state-of-the-art BEOL process modules. As schematically illustrated in FIG. 5C, a region of the BEOL structure 510B which is aligned with the array of metallic contacts 513 does not include contact pads 515 or lateral or vertical wiring in the multiple wiring layers 514, as such region of the BEOL structure 510B will eventually be removed to expose the array of metallic contacts 513.

In some embodiments, at the completion of BEOL processing, the first semiconductor wafer 510W comprises a plurality of first semiconductor IC chips (or dies) which are all the same identical type of chip (e.g., processor chip), and the second semiconductor wafer 520W comprises a plurality of second semiconductor IC chips (or dies) which are all the same identical type of chip (e.g., memory chip). The next stage of fabrication includes etching regions of the first and second semiconductor wafers 510W and 520W to expose the arrays of metallic contacts (e.g., metallic contacts 513 and 523) of all the semiconductor IC chips (dies) formed on the first and second semiconductor wafers 510W and 520W.

Figure 5D:
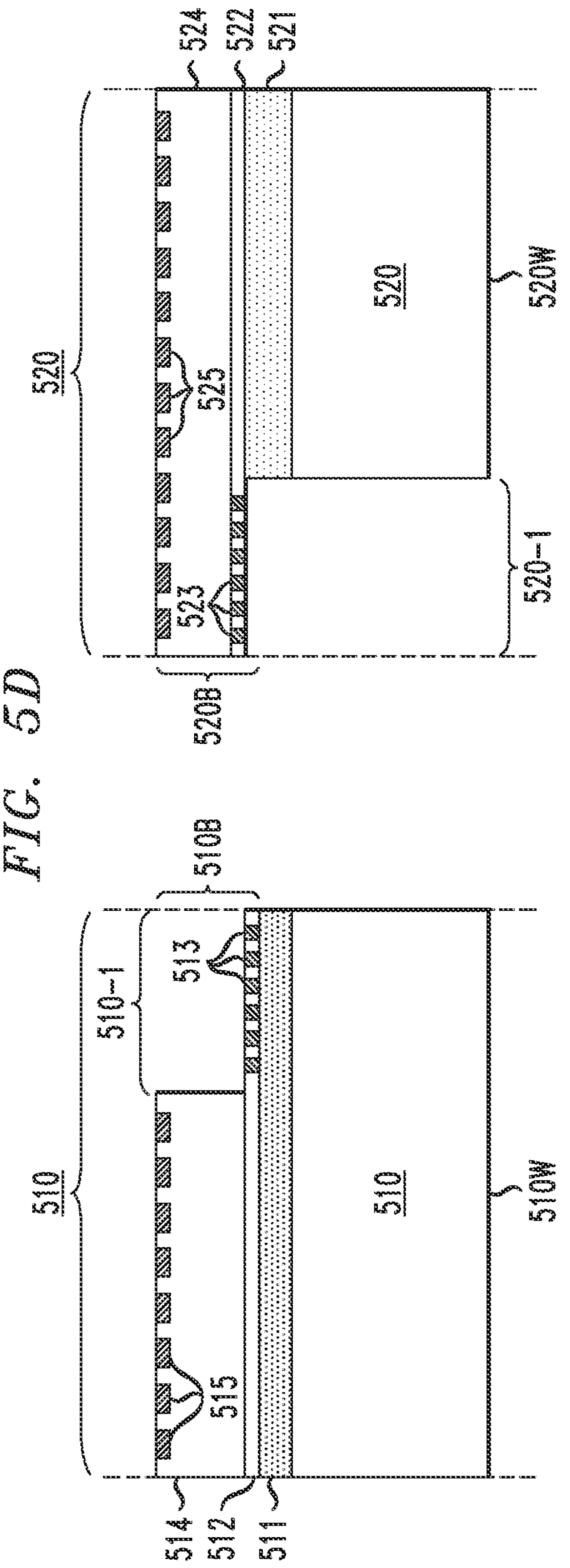

For example, FIG. 5D schematically illustrates cross-sectional side views of the first and second semiconductor wafers 510W and 520W after performing an etch process to expose the arrays of metallic contacts of first and second semiconductor IC chips 510 and 520, according to an exemplary embodiment of the disclosure. In particular, the BEOL structure 510B of the first semiconductor wafer 510W is etched using photolithographic patterning techniques to etch openings in a region of the BEOL structure 510B to expose the array of metallic contacts of all semiconductor IC chips formed on the first semiconductor wafer 510W. For ease of illustration, FIG. 5D shows a single semiconductor IC chip (first semiconductor IC chip 510) of the first semiconductor wafer 510W defined by vertical dashed lines (e.g., dicing lines), wherein an opening 510-1 is formed in the BEOL structure 510B down to the etch stop layer 512 to expose the array of metallic contacts 513.

Further, in an exemplary embodiment as shown in FIG. 5D, backside of the second semiconductor wafer 520W is etched using photolithographic patterning techniques to etch openings in a region in the backside of the second semiconductor wafer 520W to expose the array of metallic contacts of all semiconductor IC chips formed on the second semiconductor wafer 520W. For ease of illustration, FIG. 5D shows a single semiconductor IC chip (second semiconductor IC chip 520) of the second semiconductor wafer 520W which is defined by vertical dashed lines (e.g., dicing lines), wherein an opening 520-1 is formed through the backside of the second semiconductor wafer 520W and through the FEOL/MOL structure 521 down to the etch stop layer 522 to expose the array of metallic contacts 523.

Figure 5E:
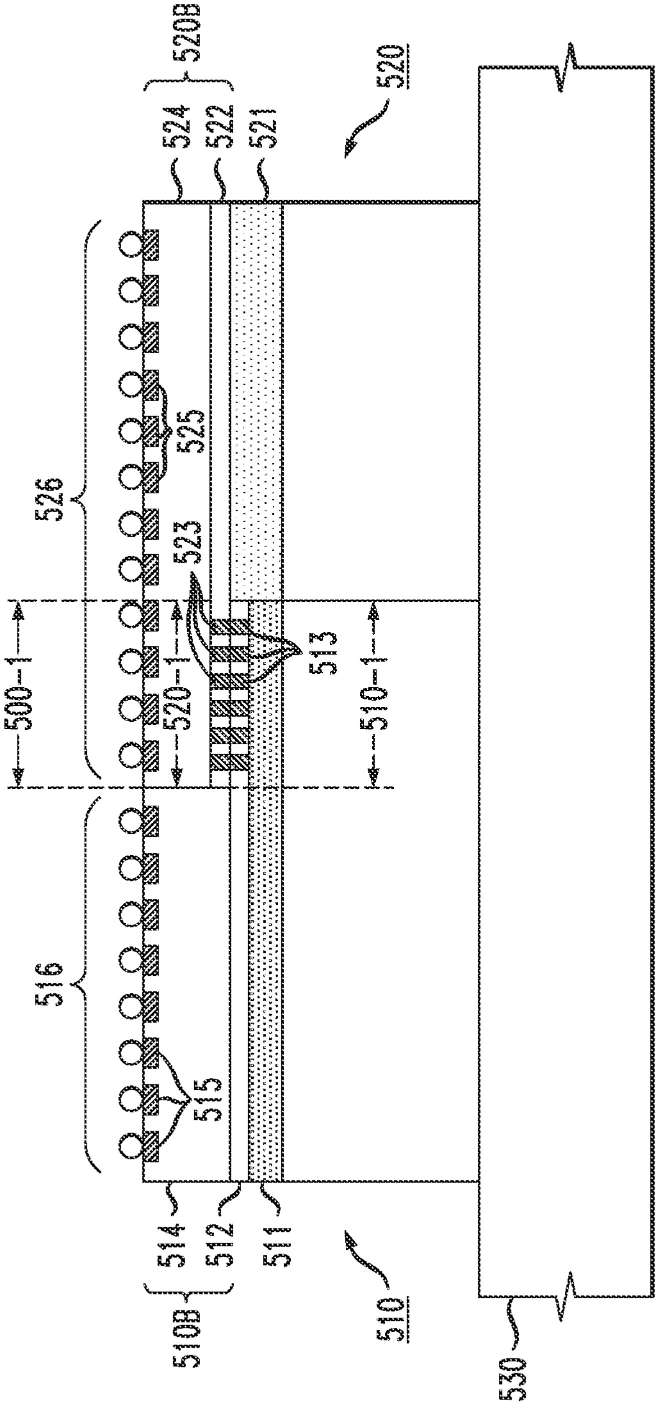

Next, FIG. 5E schematically illustrates a cross-sectional side view of a multi-chip package structure that is formed by intra-bonding the first and second semiconductor IC chips 510 and 520 removed from the first and second semiconductor wafers 510W and 520W, according to an exemplary embodiment of the disclosure. More specifically, FIG. 5E schematically illustrates a multi-chip package structure 500 comprising the first semiconductor IC chip 510 and the second semiconductor IC chip 520 which are backside mounted (temporarily) to a handler substrate 530. The first and second semiconductor IC chips 510 and 520 are disposed laterally adjacent to each other (e.g., coplanar) and intra-bonded together in an overlapping region 500-1 in which an overlap region 510-1 (corresponding to the etched opening 510-1) of the first semiconductor IC chip 510, which comprises the array of metallic contacts 513, and an overlap region 520-1 (corresponding to the etched opening 520-1) of the second semiconductor IC chip 520, which comprises the array of metallic contacts 523, are aligned and bonded together to provide a high-density array of chip-to-chip interconnections through bonding of the array of metallic contacts 513 and the array of metallic contacts 523.

The first and second semiconductor IC chips 510 and 520 can be intra-bonded using various techniques. For example, in some embodiments, an intra-bonding process comprises precision aligning the arrays of metallic contacts 513 and 523 and bonding the overlap regions 510-1 and 520-1 using any suitable bonding process. For example, bonding can be achieved through Van-der-Waals forces that form a bond between dielectric material at the surfaces of the etch stop layers 512 and 522, wherein the Van-der-Waals forces essentially pull the overlap regions 510-1 and 520-1 of the first and second semiconductor IC chips 510 and 520 together on an atomic-scale. An annealing process is then performed to cause metal diffusion between aligned contacts in the arrays of metallic contacts 513 and 523, thereby forming direct interconnects.

More specifically, in exemplary embodiments in which the arrays of metallic contacts 513 and 523 are formed of copper posts (or copper pillars), due to a large coefficient of thermal expansion (CTE) of copper, the thermal annealing causes the copper posts (which are confined (in the X and Y directions) by the etch stop layers 512 and 522), to expand (in the Z direction) at their free surfaces, and make sufficient contact between the aligned copper contacts to allow copper diffusion between the aligned copper contacts to form permanent metallurgical bonds. For example, performing a thermal anneal process in a range of 200° C. and 400° C., leads to the creation of covalent bonds at the interface of the insulating material of the etch stop layers 512 and 522, as well as metallic bonds at the copper-copper interfaces of the metallic contacts, which strengthen the entire intra-bonding interface between the first and second semiconductor IC chips 510 and 520 in the overlapping region 500-1. In this regard, intra-boding of the overlap regions 510-1 and 520-1 of the first and second semiconductor IC chips 510 and 520 can be achieved by thermal compression bonding of the arrays of metallic contacts 513 and 523 and/or covalent bonding (e.g., oxide bonding) of the etch stop layers 512 and 522.

In other embodiments, the copper posts (or pillars) which form the arrays of metallic contacts 513 and 523 have solder layer deposits or micro bumps of solder balls on the upper surfaces thereof. In such embodiments, the intra-bonding process comprises precision aligning the arrays of metallic contacts 513 and 523 and joining them together via the solder material to form the connecting bonds. While solder material (e.g., bumps) may collapse during solder reflow, the copper pillars retain their shape in the x, y, and z directions, which allows for fabrication of fine-pitch interconnects.

After the first and second semiconductor integrated circuit chips 510 and 520 are intra-bonded, solder balls 516 and 526 (e.g., C4 solder balls) are formed on the contact pads 515 and 525, respectively, using known techniques. The handler substrate 530 is then utilized to position the intra-bonded first and second semiconductor IC chips 510 and 520 on a package substrate (e.g., first level organic package substrate) and flip-chip bond the intra-bonded first and second semiconductor IC chips 510 and 520 to the package substrate using the solder bumps 516 and 526. The handler substrate 530 is then removed from the backside surfaces of the first and second semiconductor IC chips 510 and 520.

Figure 6A:
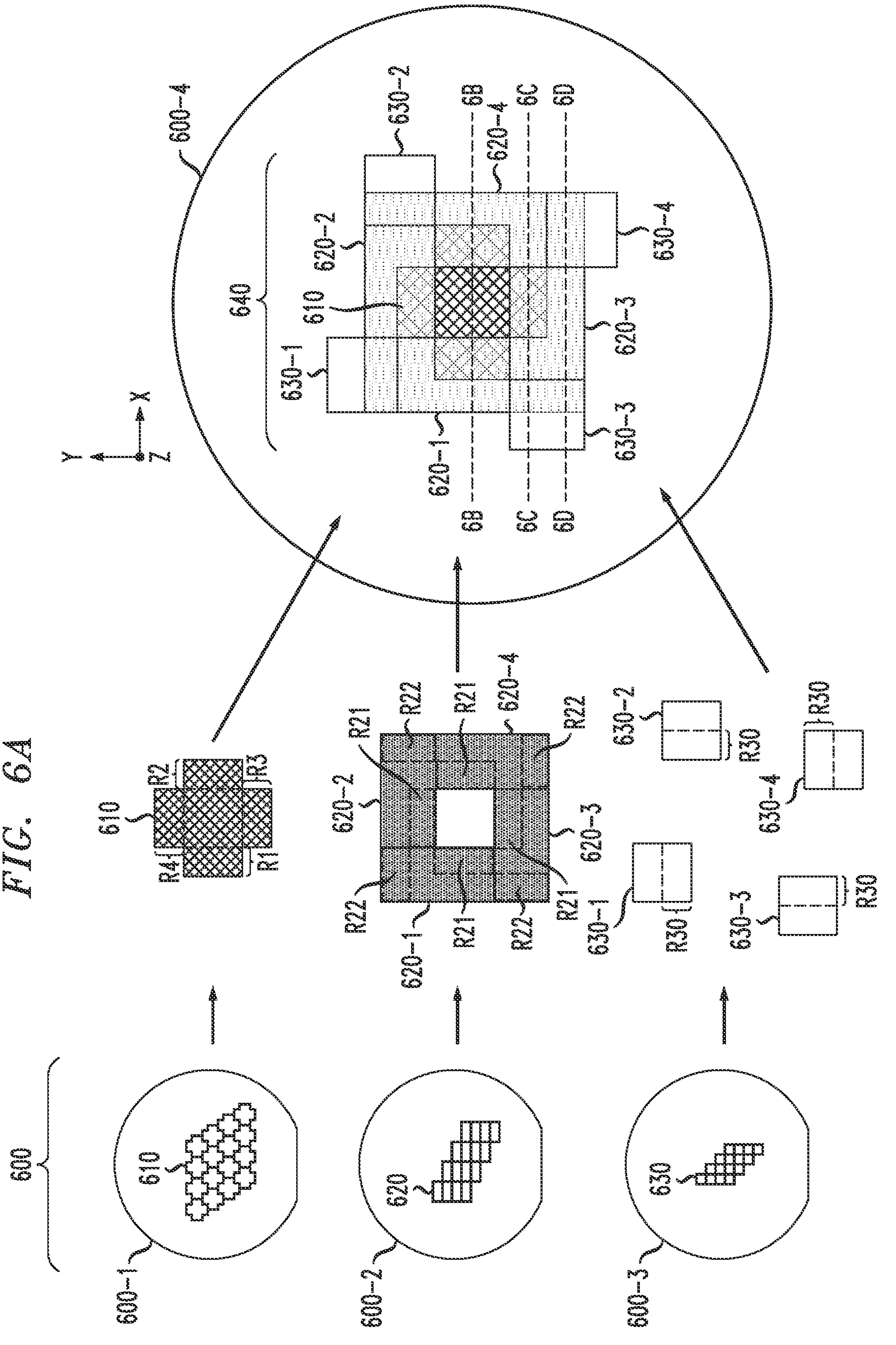
FIG. 6A schematically illustrates a process for fabricating a multi-chip package structure comprising a plurality of intra-bonded semiconductor IC chips, according to another exemplary embodiment of the disclosure.

FIG. 6A schematically illustrates a process for fabricating a multi-chip package structure comprising a plurality of intra-bonded semiconductor IC chips, according to another exemplary embodiment of the disclosure. In particular, FIG. 6A schematically illustrates a plurality of semiconductor wafers 600 including a first semiconductor wafer 600-1, a second semiconductor wafer 600-2, and a third semiconductor wafer 600-3. The first semiconductor wafer 600-1 comprises a plurality of identical semiconductor IC chips 610 (a first type of semiconductor IC chip). The second semiconductor wafer 600-2 comprises a plurality of identical semiconductor IC chips 620 (a second type of semiconductor IC chip). The third semiconductor wafer 600-3 comprises a plurality of identical semiconductor IC chips 630 (a third type of semiconductor IC chip). The semiconductor wafers 600 and corresponding semiconductor IC chips are fabricated using the same or similar techniques as discussed above in conjunction with FIGS. 5A-5E.

FIG. 6A schematically illustrates a multi-chip package structure 640 comprising a plurality of intra-bonded semiconductor IC chips which are obtained from each of the semiconductor wafers 600. For example, the multi-chip package structure 640 comprises one semiconductor IC chip 610 from the first semiconductor wafer 600-1, four semiconductor IC chips 620-1, 620-2, 620-3, and 620-4 from the second semiconductor wafer 600-2, and four semiconductor IC chips 630-1, 630-2, 630-3, and 630-4 from the third semiconductor wafer 600-3, which are arranged as schematically illustrated in FIG. 6A. The exemplary first type of semiconductor IC chip 610 comprises a cross-shaped footprint and comprises a plurality of overlap regions, including a first overlap region R1, a second overlap region R2, a third overlap region R3, and a fourth overlap region R4. The exemplary four semiconductor IC chips 620-1, 620-2, 620-3, and 620-4 are identical chips of the second type of semiconductor IC chip 620, and each comprise a rectangular-shaped footprint and a plurality of overlap regions (illustrated by dashed lines), including a first overlap region R21 and a second overlap region R22. The exemplary four semiconductor IC chips 630-1, 630-2, 630-3, and 630-4 are identical chips of the third type of semiconductor IC chip 630, and each comprise a rectangular-shaped footprint and one overlap region R30.

In an exemplary embodiment, each overlap region R1, R2, R3, and R4 of the first type of semiconductor IC chip 610 is configured to bond to the first overlap region R21 of the second type of semiconductor IC chip 620 to enable intra-bonding of the first type of semiconductor IC chip 610 to four (4) of the second type semiconductor IC chips 620. Further, each overlap region R22 of the second type of semiconductor IC chip 620 is configured to bond to the overlap region R30 of the third type of semiconductor IC chip 630 to enable intra-bonding of the second type of semiconductor IC chip 620 and the third type of semiconductor IC chip 620.

In some embodiments, the multi-chip package structure 640 is initially assembled on a handler substrate 600-4 (e.g., as discussed above in conjunction with FIG. 5E), wherein the semiconductor wafers 600-1, 600-2, and 600-3 are sequentially utilized in a process which comprises aligning a semiconductor wafer with the handler substrate 600-4, and transferring one or more target semiconductor IC chips to the handler substrate 600-4 by, e.g., laser ablating the one or more target semiconductor IC chips to release the chips from the semiconductor wafer, and temporarily bond the released semiconductor IC chips to the hander substrate 600-4.

For example, in an exemplary embodiment, the multi-chip package structure 640 is assembled by aligning the first semiconductor wafer 600-1 to the handler substrate 600-4, and releasing and bonding the semiconductor IC chip 610 to the handler substrate. A next stage in the assembly process step includes aligning the second semiconductor wafer 600-2 to the handler substrate 600-4 with, e.g., the semiconductor integrated circuit chip 620-1 properly aligned to the semiconductor IC chip 610, and releasing and bonding the semiconductor IC chip 620-1 to the handler substrate 600-4, when the semiconductor IC chips 610 and 620-1 are properly aligned. The process is repeated for the remaining semiconductor IC chips 620-2, 620-3, and 620-4, but with the second semiconductor wafer 600-2 being rotated 90 degrees to properly orientate and align the semiconductor IC chips 620-2, 620-3, and 620-4 with the semiconductor IC chip 610. A next stage in the assembly process includes aligning the third semiconductor wafer 600-3 to the handler substrate 600-4 with, e.g., the semiconductor IC chip 630-1 properly aligned to the semiconductor IC chip 620-1, and releasing and bonding the semiconductor IC chip 630-1 to the handler substrate 600-4, when the semiconductor IC chips 620-1 and 630-1 are properly aligned. The process is repeated for the remaining semiconductor IC chips 630-2, 630-3, and 630-4.

Figure 6B:
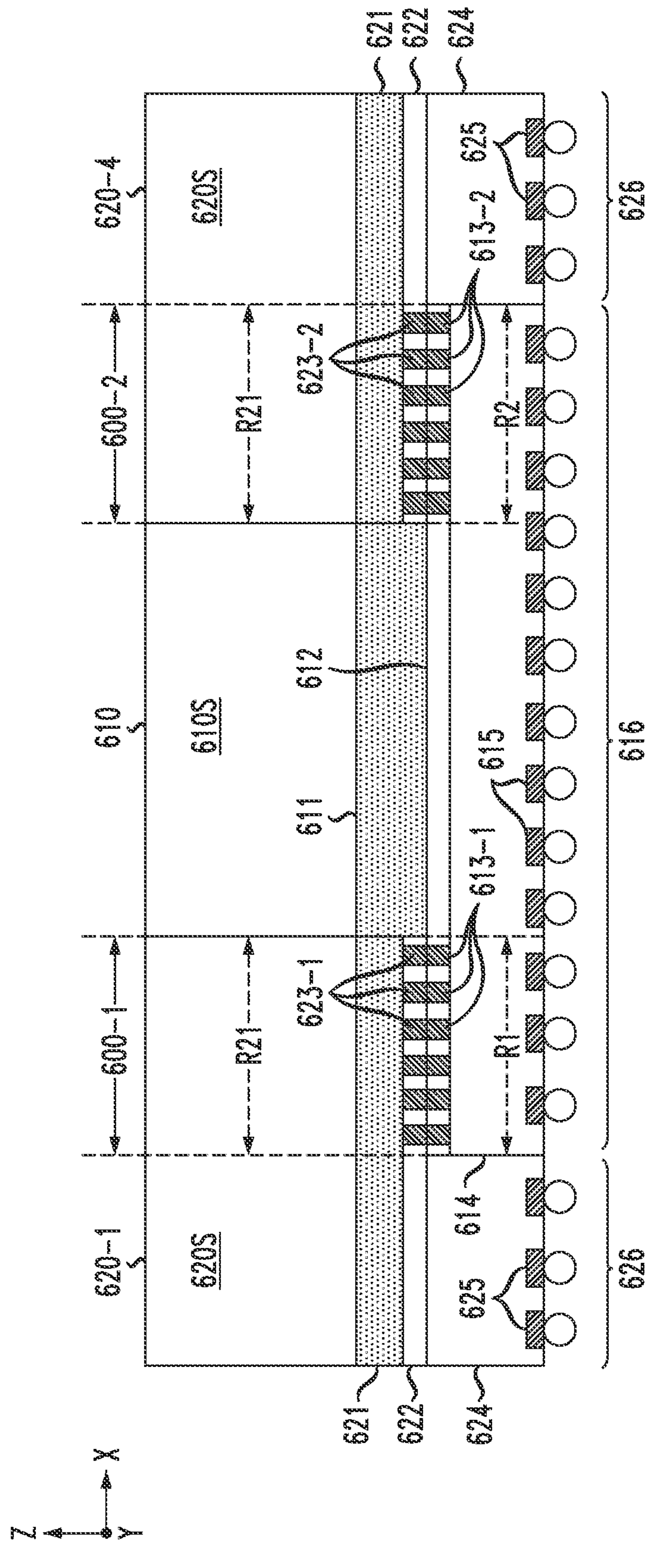
FIG. 6B is a schematic cross-sectional side view of the multi-chip package structure along line 6B-6B in FIG. 6A.
Figure 6C:
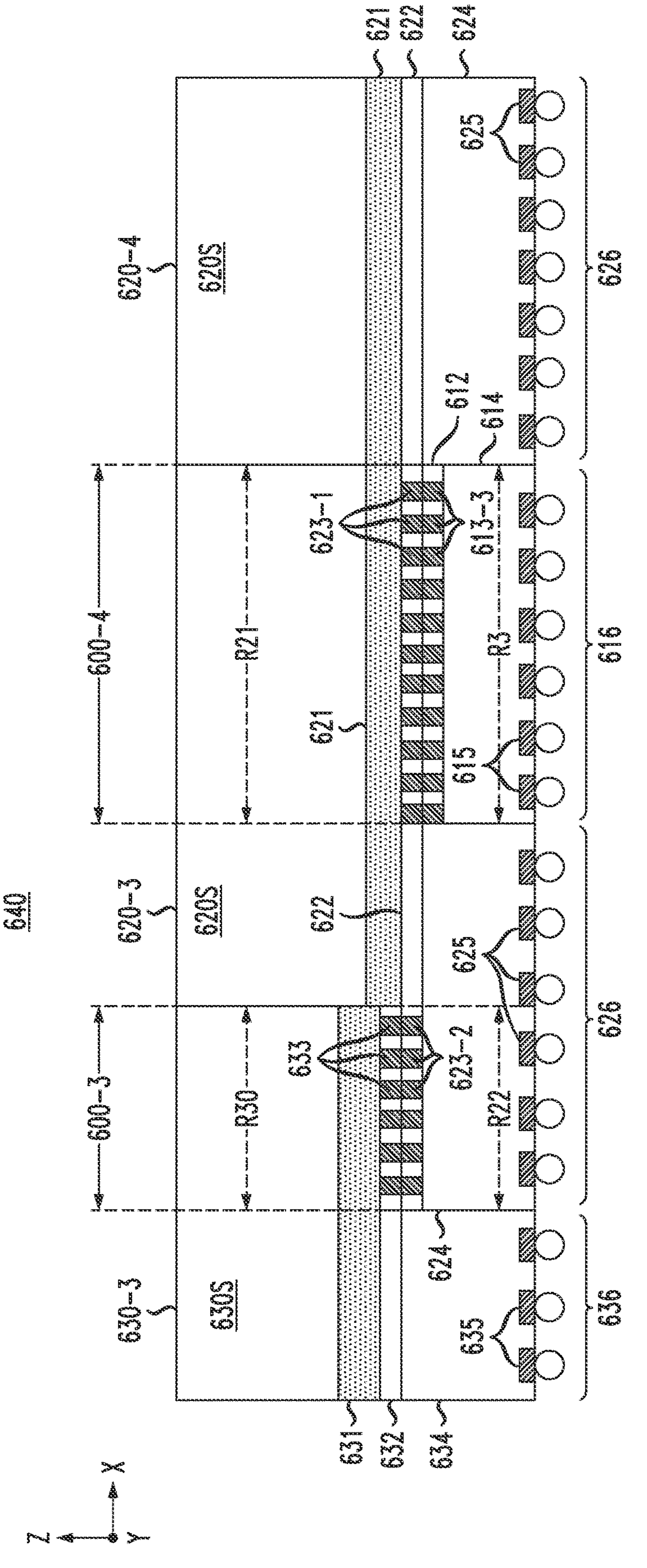
FIG. 6C is a schematic cross-sectional side view of the multi-chip package structure along line 6C-6C in FIG. 6A.
Figure 6D:
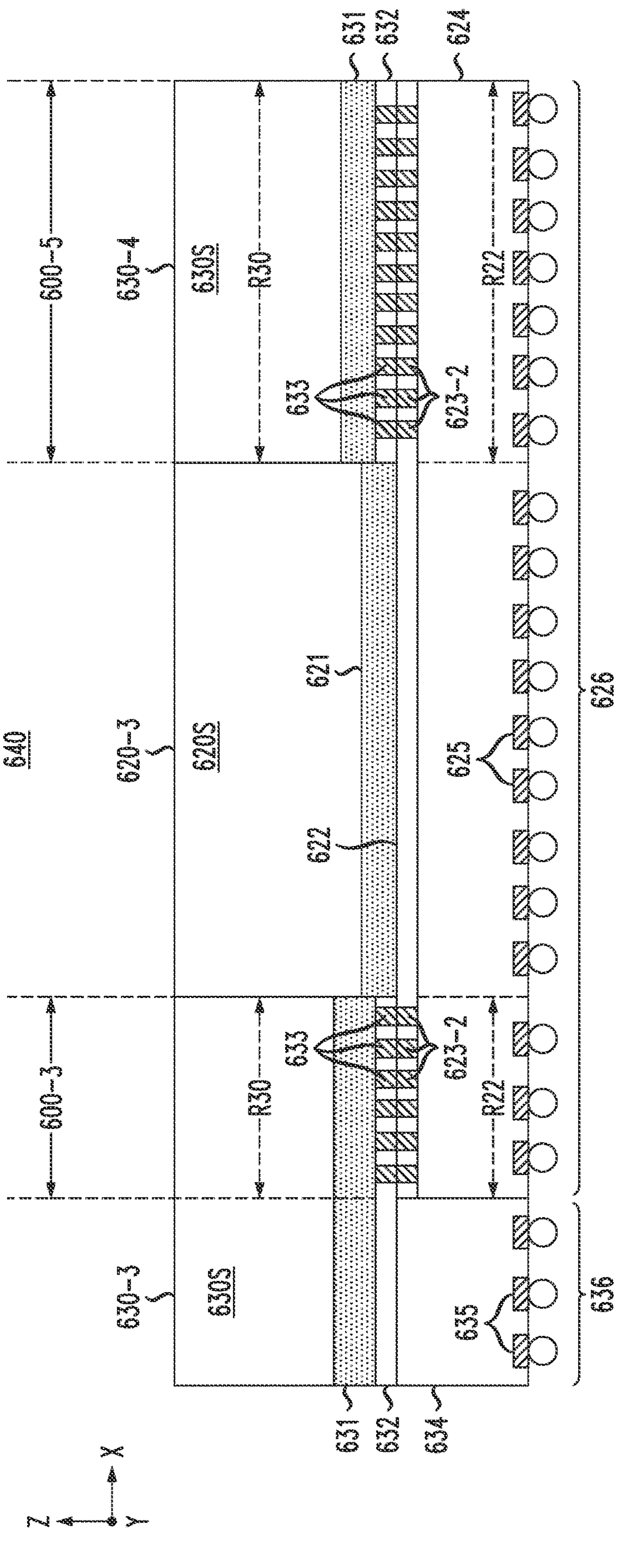
FIG. 6D is a schematic cross-sectional side view of the multi-chip package structure along line 6D-6D in FIG. 6A.

FIGS. 6B, 6C, and 6D are schematic cross-sectional side views of the multi-chip package structure 640, according to an exemplary embodiment of the disclosure. In particular, FIG. 6B is a schematic cross-sectional side view of the multi-chip package structure 640 along line 6B-6B in FIG. 6A, FIG. 6C is a schematic cross-sectional side view of the multi-chip package structure 640 along line 6C-6C in FIG. 6A, and FIG. 6D is a schematic cross-sectional side view of the multi-chip package structure 640 along line 6D-6D in FIG. 6A. In the exemplary multi-chip package structure 640 collectively shown in FIGS. 6B, 6C, and 6D, it is assumed that (i) the first type of semiconductor IC chip 610 comprises the overlap regions R1, R2, R3, and R4 which are formed by etching a backside of the semiconductor IC chip 610, (ii) the second type of semiconductor IC chip 620 comprises the first overlap region R21 which is formed by etching a region of the frontside of the semiconductor IC chip 620, and the second overlap region R22 which is formed by etching a region of the backside of the semiconductor IC chip 620, and (iii) the third type of semiconductor IC chip 630 has the overlap region R30 which is formed by etching a region of the frontside of the semiconductor IC chip 630.

More specifically, as shown in FIG. 6B, the semiconductor IC chip 610 comprises a base semiconductor substrate 610S, a FEOL/MOL structure 611 (which is formed on a frontside of the base semiconductor substrate 610S), and a BEOL structure comprising an etch stop layer 612, a first array of metallic contacts 613-1 (e.g., metallic posts) and a second array of metallic contacts 613-2 (e.g., metallic posts) embedded in the etch stop layer 612, multiple wiring levels 614, and an array of contact pads 615 and solder balls 616 (e.g., C4 solder balls) disposed on the contact pads 615. The first array of metallic contacts 613-1 are disposed in the first overlap region R1 of the semiconductor IC chip 610, and the second array of metallic contacts 613-2 are disposed in the second overlap region R2 of the semiconductor IC chip 610. As noted above, in some embodiments as schematically shown in FIG. 6B, the first and second overlap regions R1 and R2 of the semiconductor IC chip 610 are formed by etching corresponding regions of the backside of the semiconductor IC chip 610 down to the etch stop layer 612 to expose the first and second arrays of metallic contacts 613-1 and 613-2.

Further, the semiconductor IC chips 620-1 and 620-4 (which are identical chips of the second type of semiconductor IC chip 620) each comprise a base semiconductor substrate 620S, a FEOL/MOL structure 621 (which is formed on a frontside of the base semiconductor substrate 620S), and a BEOL structure comprising an etch stop layer 622, a first array of metallic contacts 623-1 disposed in the etch stop layer 622, multiple wiring levels 624, and an array of contact pads 625 and solder balls 626 (e.g., C4 solder balls) disposed on the contact pads 625. The first array of metallic contacts 623-1 are disposed in the first overlap region R21 of the semiconductor IC chips 620-1 and 620-4. As noted above, in some embodiments as schematically shown in FIG. 6B, the first overlap region R21 of the identical semiconductor IC chips 620-1 and 620-4 is formed by etching a corresponding region of the backside of the semiconductor IC chips 620-1 and 620-4 down to the etch stop layer 622 to expose the first array of metallic contacts 623-1.

As schematically illustrated in FIG. 6B, the semiconductor IC chips 610 and 620-1 are disposed laterally adjacent to each other (e.g., coplanar) and bonded together in a first overlapping region 600-1 of the multi-chip package structure 640. In addition, the semiconductor IC chips 610 and 620-4 are disposed laterally adjacent to each other (e.g., coplanar) and bonded together in a second overlapping region 600-2 of the multi-chip package structure 640. The first overlapping region 600-1 of the multi-chip package structure 640 comprises die-to-die connections between the semiconductor IC chips 610 and 620-1 as a result of connecting the arrays of metallic contacts 613-1 and 623-1. The second overlapping region 600-2 of the multi-chip package structure 640 comprises die-to-die connections between the semiconductor IC chips 610 and 620-4 as a result of connecting the arrays of metallic contacts 613-2 and 623-1.

Next, FIG. 6C schematically illustrates the intra-bonding of the semiconductor IC chip 620-3 to the semiconductor IC chip 610 (in particular, overlap region R3 of the semiconductor IC chip 610) and to the semiconductor IC chip 630-3. As shown in FIG. 6C, the semiconductor IC chip 630-3 comprises a base semiconductor substrate 630S, a FEOL/MOL structure 631 (which is formed on a frontside of the base semiconductor substrate 630S), and a BEOL structure comprising an etch stop layer 632, an array of metallic contacts 633 (e.g., metallic posts) embedded in the etch stop layer 632, multiple wiring levels 634, and an array of contact pads 635 and solder balls 636 (e.g., C4 solder balls) disposed on the contact pads 635. The array of metallic contacts 633 are disposed in the overlap region R30 of the semiconductor IC chip 630-3. As noted above, in some embodiments as schematically shown in FIG. 6C, the overlap regions R30 of the semiconductor IC chip 630-3 is formed by etching a corresponding region of the frontside of the semiconductor IC chip 630-3 down to the etch stop layer 632 to expose the array of metallic contacts 633.

The structure of the semiconductor IC chip 610 shown in FIG. 6C is the same as that shown in FIG. 6B, except that FIG. 6C only shows the third overlap region R3 of the semiconductor IC chip 610 which comprises a third array of contacts 613-3 disposed in the etch stop layer 612 of the semiconductor IC chip 610. In addition, the structure of the semiconductor IC chip 620-3 (second type of semiconductor IC chip 620) in FIG. 6C is identical to the structure of the semiconductor IC chips 620-1 and 620-4 (second type of semiconductor IC chip 620) as discussed above in conjunction with FIG. 6B, the details of which will not be repeated. However, FIG. 6C shows the second overlap region R22 of the semiconductor IC chip 620-3 which comprises a second array of contacts 623-2 disposed in the etch stop layer 622 of the semiconductor IC chip 620-3.

As schematically illustrated in FIG. 6C, the semiconductor IC chips 620-3 and 630-3 are disposed laterally adjacent to each other (e.g., coplanar) and bonded together in a third overlapping region 600-3 of the multi-chip package structure 640. In addition, the semiconductor IC chips 610 and 620-3 are disposed laterally adjacent to each other (e.g., coplanar) and bonded together in a fourth overlapping region 600-4 of the multi-chip package structure 640. The third overlapping region 600-3 of the multi-chip package structure 640 comprises die-to-die connections between the semiconductor IC chips 620-3 and 630-3 as a result of connecting the arrays of metallic contacts 623-2 and 633. The fourth overlapping region 600-4 of the multi-chip package structure 640 comprises die-to-die connections between the semiconductor IC chips 610 and 620-3 as a result of connecting the arrays of metallic contacts 613-3 and 623-1.

Next, FIG. 6D schematically illustrates the additional intra-boding of the semiconductor IC chip 620-3 and the semiconductor IC chip 630-4. The structure of the semiconductor IC chip 630-4 (third type of semiconductor IC chip 630) shown in FIG. 6D has the same structure as the semiconductor IC chip 630-3 shown in FIGS. 6C and 6D, the details of which will not be repeated. As schematically illustrated in FIG. 6D, the semiconductor IC chips 620-3 and 630-4 are disposed laterally adjacent to each other (e.g., coplanar) and bonded together in a fifth overlapping region 600-5 of the multi-chip package structure 640. The fifth overlapping region 600-5 of the multi-chip package structure 640 comprises die-to-die connections between the semiconductor IC chips 620-3 and 630-4 as a result of connecting the arrays of metallic contacts 623-2 and 633 in the respective overlap regions R22 and R30.

The exemplary package structure 640 collectively shown in FIGS. 6A-6D is based on the particular etching configurations (backside and/or frontside etching) as noted above for (i) forming the overlap regions R1, R2, R3, and R4 of the first type of semiconductor IC chip 610, (ii) forming the overlap regions R21 and R22 of the second type of semiconductor IC chip 620, and (iii) forming the overlap region R30 of the third type of semiconductor IC chip 630. It is to be understood, however, that other etching configurations can be implemented for the different types of semiconductor IC chips 610, 620, and 630. For example, in some embodiments, (i) the overlap regions R1, R2, R3, and R4 of the first type of semiconductor IC chip 610 can be formed by etching corresponding regions in the frontside of the semiconductor IC chip 610, (ii) the first and second overlap regions R21 and R22 of the second type of semiconductor IC chip 620 can be formed by etching corresponding regions in the backside of the semiconductor IC chip 620, and (iii) the overlap region R30 of the third type of semiconductor IC chip 630 can be formed by etching a region of the backside of the semiconductor IC chip 630. Other etching configurations are possible.

In some embodiments, the semiconductor IC chips can be fabricated to include intra-bonding regions with mechanical structures which are structurally configured to facilitate alignment (e.g., X and Y alignment) of the overlapping portions of the semiconductor IC chips and, thus, alignment, of the corresponding arrays of metallic contacts (e.g., copper posts) in the overlapping portions of the semiconductor IC chips. With the exemplary alignment processes, the mechanical structures comprise features that are formed through precision etching processes, which enable submicron resolution for alignment (which resolution cannot be achieved using visual alignment techniques due to the diffraction limit of visible light which does not allow for visual alignment at submicron resolutions). For example, FIGS. 7A, 7B, 7C, and 7D schematically illustrate different mechanical structures that can be utilized to enable self-alignment and interlocking of overlapping portions of intra-bonded semiconductor IC chips.

Figure 7A:
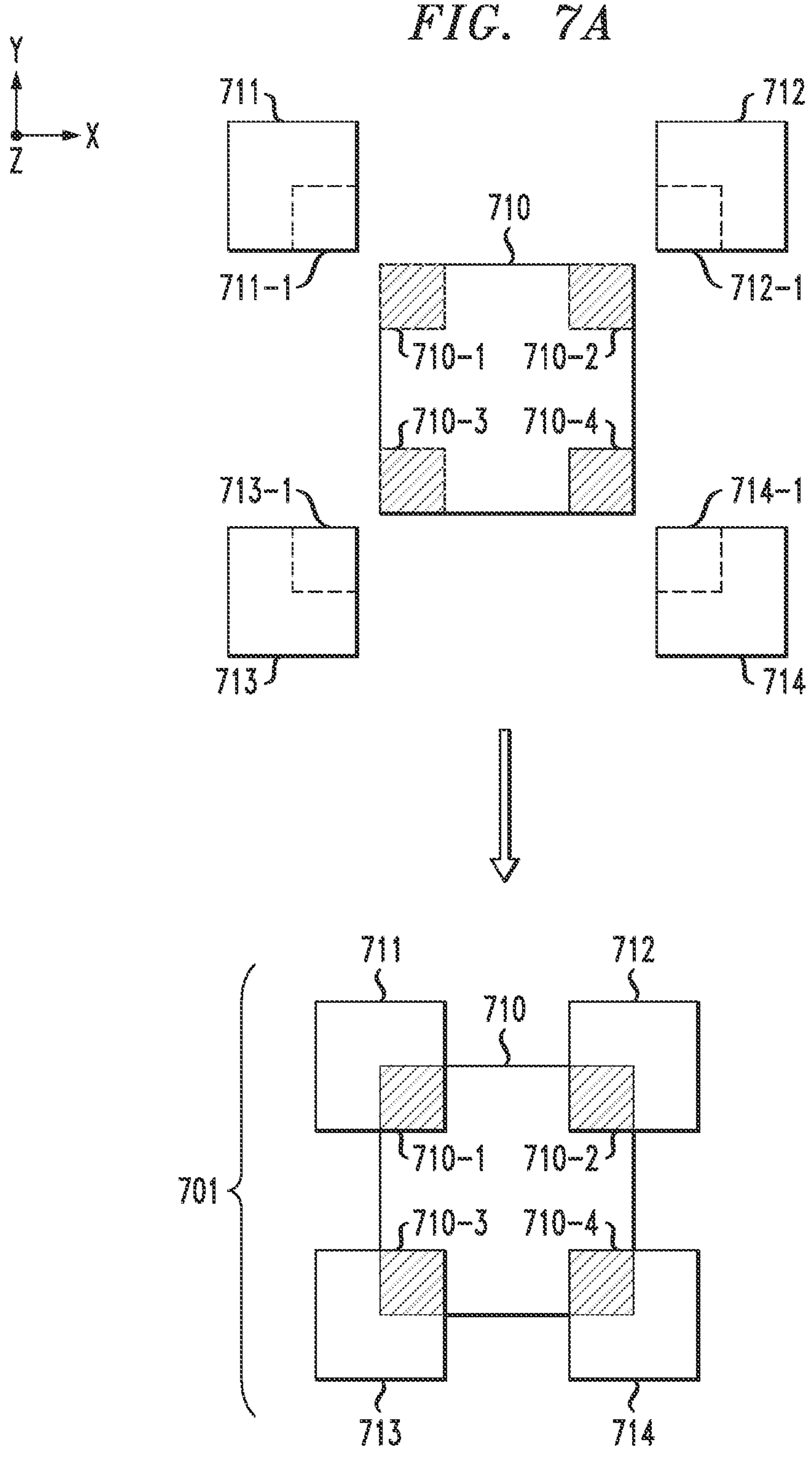
FIG. 7A schematically illustrates a self-alignment process for intra-bonding a plurality of semiconductor integrated circuit chips, according to an exemplary embodiment of the disclosure.

In particular, FIG. 7A schematically illustrates a self-alignment process for intra-bonding of a plurality of semiconductor IC chips 710, 711, 712, 713, and 714. FIG. 7A is a schematic top plan view which shows backsides of the semiconductor IC chips 710, 711, 712, 713, and 714. The semiconductor IC chip 710 comprises rectangular-shaped overlap regions 710-1, 710-2, 710-3, and 710-4 (represented by hash shaded regions) which are formed by etching corner regions of the backside of the semiconductor IC chip 710 down to an etch stop layer to expose respective arrays of metallic contacts that are disposed in the overlap regions 710-1, 710-2, 710-3, and 710-4. In addition, the semiconductor IC chips 711, 712, 713, and 714 comprise respective rectangular-shaped overlap regions 711-1, 712-1, 713-1, and 714-1 (shown in phantom in dashed outlines) which are formed by etching a corner region in the frontside of each semiconductor IC chips 711, 712, 713, and 714 down to a respective etch stop layer to expose respective arrays of metallic contacts that are disposed in the overlap regions 711-1, 712-1, 713-1, and 714-1.

In FIG. 7A, self-alignment of the overlap regions in the X and Y direction is achieved by butting sidewall surfaces which define the overlap regions of two semiconductor IC chips. For example, FIG. 7A shows a multi-chip package structure 701 that is formed using a self-alignment process in which the semiconductor IC chip 710 is intra-bonded to the semiconductor IC chips 711, 712, 713, and 714 at the corners of the semiconductor IC chip 710. For example, to enable self-alignment (in X and Y directions) of the semiconductor IC chips 710 and 711 for intra-bonding the overlap regions 710-1 and 711-1, the sidewall surfaces that define the overlap region 711-1 of the semiconductor IC chip 711 are butt up against the corresponding sidewall surfaces that define the overlap region 710-1 of the semiconductor IC chip 710. A similar self-alignment process is performed to intra-bond the other semiconductor IC chips 712, 713, and 714 to the respective corners of the semiconductor IC chip 710.

Figure 7B:
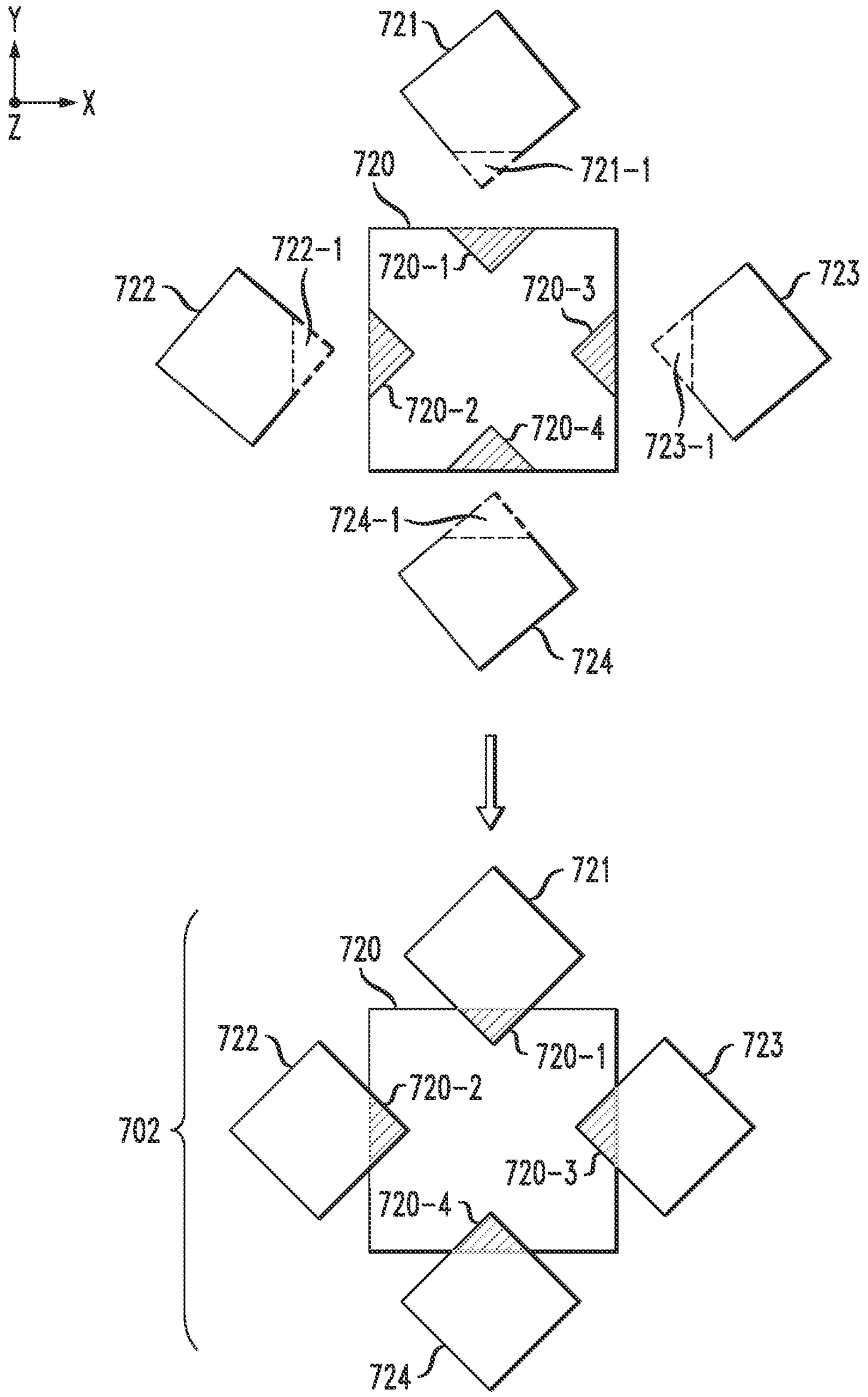
FIG. 7B schematically illustrates a self-alignment process for intra-bonding a plurality of semiconductor integrated circuit chips, according to another exemplary embodiment of the disclosure.

Next, FIG. 7B schematically illustrates a self-alignment process which enables alignment and intra-bonding of a plurality of semiconductor IC chips 720, 721, 722, 723, and 724. FIG. 7B is a schematic top plan view which shows backsides of the semiconductor IC chips 720, 721, 722, 723, and 724. The semiconductor IC chip 720 comprises triangular-shaped overlap regions 720-1, 720-2, 720-3, and 720-4 (represented by hash shaded regions) which are formed by etching regions of the backside of the semiconductor IC chip 720, at each side of the semiconductor IC chip 720, down to an etch stop layer to expose respective arrays of metallic contacts that are disposed in the overlap regions 720-1, 720-2, 720-3, and 720-4. In addition, the semiconductor IC chips 721, 722, 723, and 724 comprise respective triangular-shaped overlap regions 721-1, 722-1, 723-1, and 724-1 (shown in phantom in dashed outlines) which are formed by etching a corner region in the frontside of each semiconductor IC chip 721, 722, 723, and 724 down to a respective etch stop layer to expose respective arrays of metallic contacts that are disposed in the overlap regions 721-1, 722-1, 723-1, and 724-1.

In FIG. 7B, self-alignment of the overlap regions in the X and Y direction is achieved by butting sidewall surfaces which define the overlap regions of two semiconductor IC chips. For example, FIG. 7B shows a multi-chip package structure 702 that is formed using a self-alignment process in which the semiconductor IC chip 720 is intra-bonded to the semiconductor IC chips 721, 722, 723, and 724 at the four sides of the semiconductor IC chip 720. For example, to enable self-alignment (in X and Y directions) of the semiconductor IC chips 720 and 721 for intra-bonding the overlap regions 720-1 and 721-1, the sidewall surfaces that define the overlap region 721-1 of the semiconductor IC chip 721 are butt up against the corresponding sidewall surfaces that define the overlap region 720-1 of the semiconductor IC chip 720. A similar self-alignment process is performed to intra-bond the other semiconductor IC chips 722, 723, and 724 to the respective sides of the semiconductor IC chip 720.

Figure 7C:
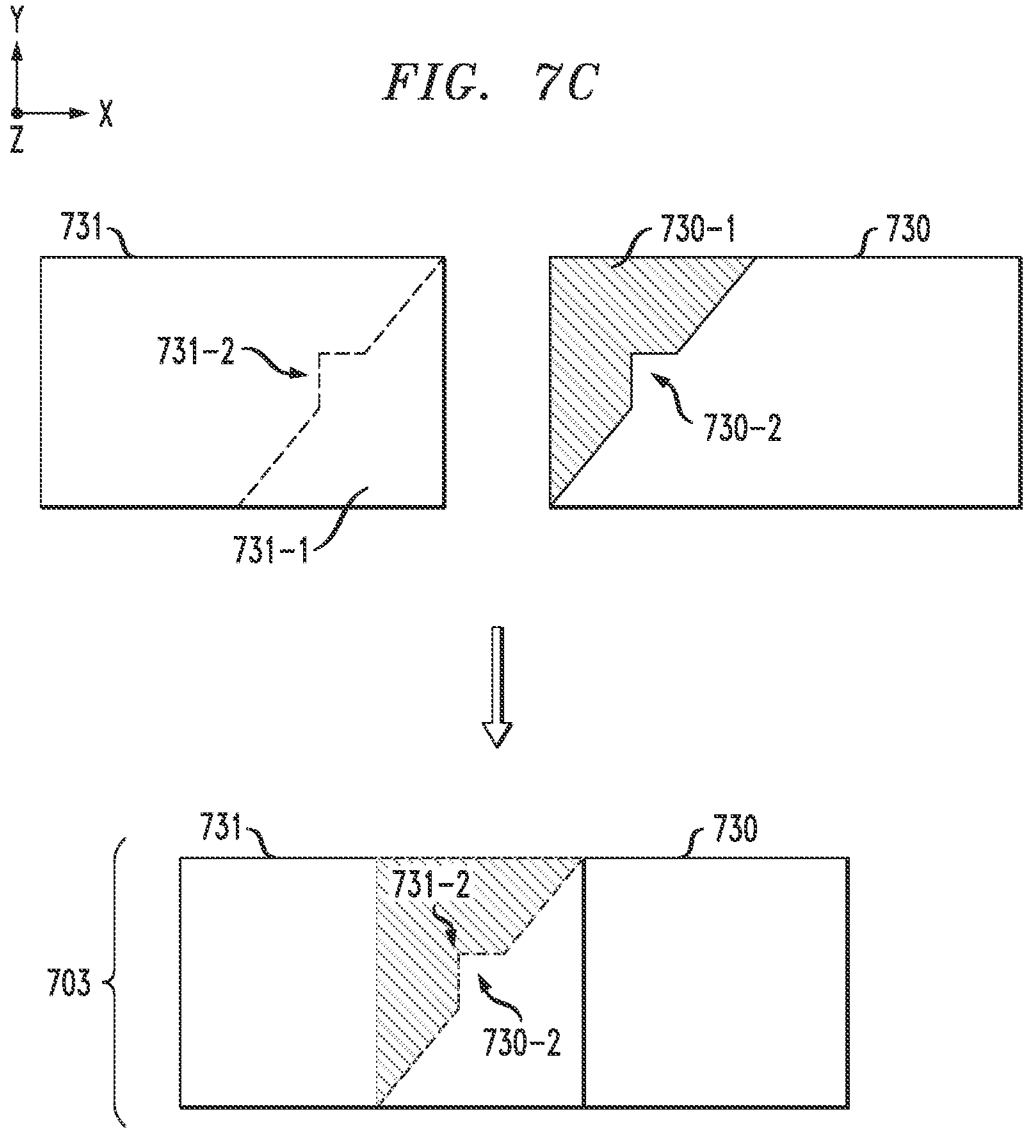
FIG. 7C schematically illustrates a self-alignment process for intra-bonding a plurality of semiconductor integrated circuit chips, according to another exemplary embodiment of the disclosure.

Next, FIG. 7C schematically illustrates a self-alignment process which enables alignment and intra-bonding of a plurality of semiconductor IC chips 730 and 731. FIG. 7C is a schematic top plan view which shows backsides of the semiconductor IC chips 730 and 731. The semiconductor IC chip 730 comprises triangular-shaped overlap region 730-1 (represented by hash shaded regions) which is formed by etching a region of the backside of the semiconductor IC chip 730 (at one end thereof) down to an etch stop layer to expose an array of metallic contacts that is disposed in the overlap region 730-1. As further shown in FIG. 7C, the etch process is configured to form a triangular-shaped tongue structure 730-2. In addition, the semiconductor IC chip 731 comprises a triangular-shaped overlap region 731-1 and corresponding triangular-shaped notch structure 731-2 (shown in phantom in dashed outlines), which are formed by etching a region in the frontside of the semiconductor IC chip 731 (at one end thereof) down to a respective etch stop layer to expose an array of metallic contacts that is disposed in the overlap region 731-1.

In FIG. 7C, self-alignment of the overlap regions in the X and Y direction is achieved by butting sidewall surfaces which define the overlap regions of two semiconductor IC chips. For example, FIG. 7C shows a multi-chip package structure 703 that is formed using a self-alignment process in which the semiconductor IC chip 730 is intra-bonded to the semiconductor IC chip 731. For example, to enable self-alignment (in X and Y directions) of the semiconductor IC chips 730 and 731 and intra-bond the overlap regions 730-1 and 731-1, the sidewall surfaces that define the overlap region 731-1 of the semiconductor IC chip 731 are butt up against the corresponding sidewall surfaces that define the overlap region 730-1 of the semiconductor IC chip 730, wherein the triangular-shaped tongue structure 730-2 is disposed in the triangular-shaped notch element 731-2 to provide interlocked, self-aligned overlapped regions 730-1 and 731-1.

Figure 7D:
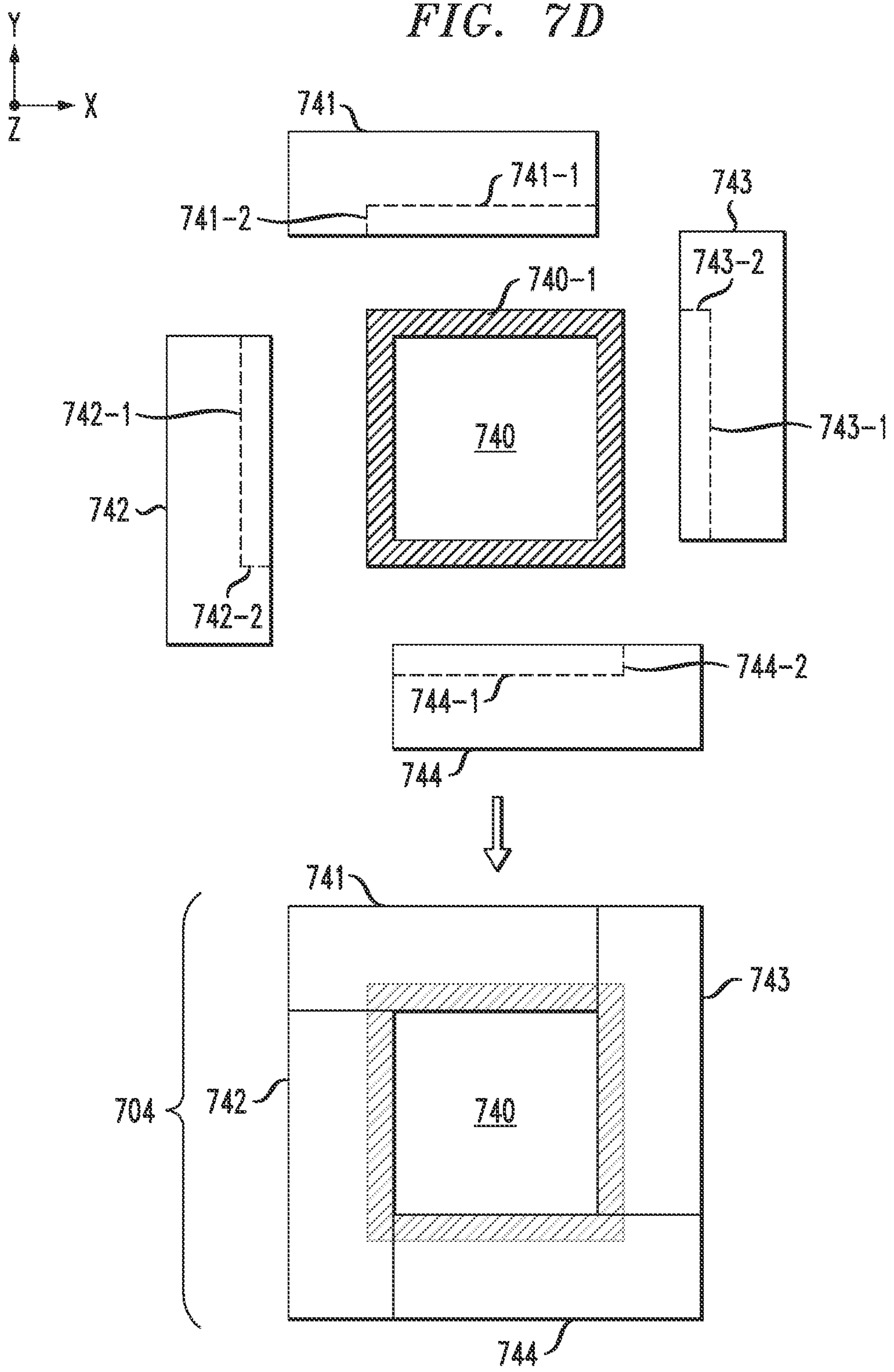
FIG. 7D schematically illustrates a self-alignment process for intra-bonding a plurality of semiconductor integrated circuit chips, according to another exemplary embodiment of the disclosure.

FIG. 7D schematically illustrates a self-alignment process which enables alignment and intra-bonding of a plurality of semiconductor IC chips 740, 741, 742, 743, and 744. FIG. 7D is a schematic top plan view which shows backsides of the semiconductor IC chips 740, 741, 742, 743, and 744. The semiconductor IC chip 740 comprises an overlap region 740-1 (represented by a hash shaded region) which is formed around an entire perimeter region of the semiconductor IC chip 740 by etching the perimeter region of the backside of the semiconductor IC chip 740 down to an etch stop layer to expose respective arrays of metallic contacts that are disposed in the overlap region 740-1 on each side of the semiconductor IC chip 740.

In addition, the semiconductor IC chips 741, 742, 743, and 744 comprise respective rectangular-shaped overlap regions 741-1, 742-1, 743-1, and 744-1 (shown in phantom in dashed outlines) which are formed by etching a portion of a side region in the frontside of each semiconductor IC chips 741, 742, 743, and 744 down to a respective etch stop layer to expose respective arrays of metallic contacts that are disposed in the overlap regions 741-1, 742-1, 743-1, and 744-1. As schematically illustrated in FIG. 7D, the overlap regions 741-1, 742-1, 743-1, and 744-1 are not formed along an entire length of the respective semiconductor IC chips 741, 742, 743, and 744, but rather the overlap regions 741-1, 742-1, 743-1, and 744-1 have respective stop edges 741-2, 742-2, 743-2, and 744-2, to provide another surface to facilitate X-Y alignment.

In FIG. 7D, self-alignment of the overlap regions in the X and Y direction is achieved by butting sidewall surfaces which define the overlap regions of two semiconductor IC chips. For example, FIG. 7D shows a multi-chip package structure 704 that is formed using a self-alignment process in which the semiconductor IC chip 740 is intra-bonded to the semiconductor IC chips 741, 742, 743, and 744 at each side of the semiconductor IC chip 740. For example, to enable self-alignment (in the X and Y directions) of the semiconductor IC chips 740 and 741 for intra-bonding the overlap regions 740-1 and 741-1, the sidewall surfaces that define the overlap region 741-1 of the semiconductor IC chip 741 are butt up against the corresponding sidewall surfaces that define the overlap region 740-1 of the semiconductor IC chip 740, as shown in FIG. 7D. A similar self-alignment process is performed to intra-bond the other semiconductor IC chips 742, 743, and 744 to the respective corners of the semiconductor IC chip 740.

Figure 8:
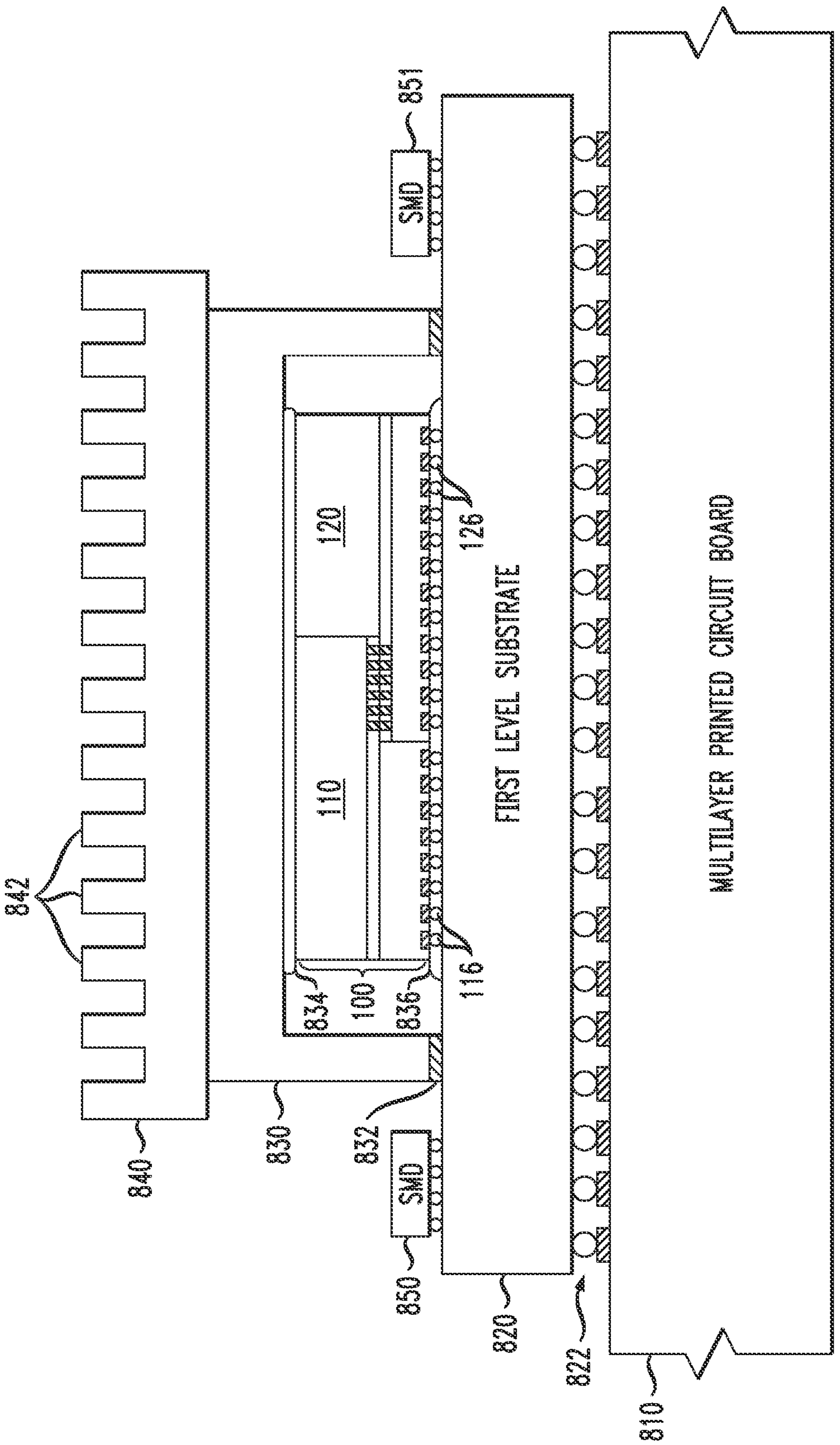
FIG. 8 is a schematic cross-sectional side view of a package structure comprising a multi-chip package structure comprising a plurality of intra-bonded semiconductor integrated circuit chips, according to an exemplary embodiment of the disclosure.

FIG. 8 is a schematic cross-sectional side view of a package structure comprising a multi-chip module comprising a plurality of intra-bonded semiconductor IC chips, according to an exemplary embodiment of the disclosure. In particular, FIG. 8 schematically illustrates a package structure 800 comprising a multilayer printed circuit board 810 (second level package substrate), a first level package substrate 820, an area array of solder ball interconnects 822 (e.g., Ball Grid Array (BGA) solder interconnects) formed on a bottom side of the first level package substrate 820, the exemplary multi-chip package structure 100 (FIG. 1) comprising intra-bonded semiconductor integrated circuit chips 110 and 120, mounted on the first level package substrate 820, a package lid 830, a heat sink 840, and a plurality of surface mounted devices 850 and 851, which are mounted on the first level package substrate 820.

In some embodiments, the first level package substrate 820 comprises ceramic substrate, a silicon interposer, a high-density organic laminate build-up substrate (with a redistribution fan-out layer), or any other types of package substrate technology that is suitable for the given application. The first level package substrate 820 is electrically and mechanically bonded to the multilayer printed circuit board 810 by the area array of solder ball interconnects 822 (e.g., BGA solder interconnects) formed on the bottom side of the first level package substrate 820. In some embodiments, the area array of solder ball interconnects 822 (e.g., BGA C4s) are formed with a contact pitch of about 300 microns or less, depending on the application. The exemplary multi-chip package structure 100 (of FIG. 1) is electrically and mechanically bonded to the first level package substrate 820 using, e.g., C4 solder balls 116 and 126, wherein the solder bump connections are encapsulated in a layer of underfill material 836. The underfill material 836 comprises an electrically-insulating adhesive material which is utilized to maintain the structural integrity of the flip-chip C4 solder connections between the first and second semiconductor IC chips 110 and 120 of the multi-chip package structure 100 and the underlying first level package substrate 820.

The package lid 830 is configured to cover, protect, and provide more uniform thermal diffusion to the heat sink 840 for the multi-chip package structure 100. In some embodiments, the package lid 830 comprises a metallic lid (e.g., copper lid) that is mounted to the first level package substrate 820 using bonding material 832 which can be solder or epoxy, etc. The package lid 830 is thermally coupled to the backside surfaces of the first and second semiconductor IC chips 110 and 120 through a layer of thermal interface material (TIM) 834 that is disposed between the package lid 830 and the backside surfaces of the first and second semiconductor integrated circuit chips 110 and 120. The heat sink 840 is disposed on top of the package lid 830. The package lid 830 serves as a heat spreading lid that absorbs heat from the first and second semiconductor IC chips 110 and 120 and transfers thermal energy to the heat sink 840, wherein the heat sink 840 comprises a plurality of thermal fins 842 which are configured transfer heat from the heat sink 840 to the ambient environment.

It is to be noted that FIG. 8 illustrates an exemplary embodiment of a package lid 830 which is configured for the multi-chip package structure 100 in which the semiconductor IC chips 110 and 120, as shown, have essentially the same thickness, or same vertical height above the substrate 820 (i.e., the backside surface of the multi-chip package structure 100 is planar). In other embodiments, a multi-chip package structure with intra-bonded semiconductor IC chips can have a non-planar backside surface due to different vertical heights or thicknesses of the intra-bonded semiconductor IC chips. As noted above, in such embodiments, the package lid 830 can be designed to have regions of different thicknesses that are aligned to the semiconductor IC chips with the different vertical heights or thicknesses so that the inner surfaces of the package lid 830 would be disposed close to the backside surfaces of the different thickness/height semiconductor IC chips, while the upper surface of the package lid 830 would remain planar (as shown in FIG. 8) to accommodate the planar heat sink 840 on top of the package lid 830.

As further shown in FIG. 8, a plurality of surface mounted devices 850 and 851 are mounted on the first level package substrate 820. The surface mounted devices 850 and 851 can be any type of active or passive electronic devices (e.g., transistors, capacitors, inductors, etc.) that are utilized for a given application.

It is to be appreciated that the chip intra-bonding techniques as disclosed herein enable construction of multi-chip package structures and modules which provide various advantages over conventional 2-D and 3-D packaging structures and techniques as discussed above. For example, as compared to 3-D stacking techniques, the exemplary chip intra-bonding techniques disclosed herein do not require the use of TSVs to provide interconnects between adjacent chips, wherein the TSVs provide various issues as discussed above. In addition, the exemplary chip intra-bonding techniques disclosed herein enable the formation of highly integrated package structures with low package footprint, while allowing cooling structures (e.g., package lid, head sink, etc.) to be thermally coupled directly to each of the semiconductor IC chips in the multi-chip package (such as shown in FIG. 8). In addition, the direct chip-to-chip connections provided in overlapping regions of intra-bonded chips enable high-density and direct chip-to-chip I/O communication between adjacent chips with short interconnect lengths, while allowing, in certain embodiments, power delivery to be provided to the chips from the underlying package substrate.

Furthermore, as compared to 2-D stacking, notwithstanding that the exemplary chip intra-bonding techniques disclosed herein provide multi-chip package structures with IC chips that are mounted and disposed laterally adjacent to each other (e.g., in a single plane, coplanar to each other), the overlapping of the intra-bonded chips effectively results in a smaller package footprint for a multi-chip package comprising two or more intra-bonded chips. Furthermore, the direct chip-to-chip connections provided in overlapping regions between adjacent intra-bonded chips enables high-density, direct chip-to-chip I/O communication between adjacent chips with short interconnect lengths, as compared to conventional 2-D packaging techniques which require I/O between adjacent IC chips to be implemented using chip-to-substrate and substrate-to-chip connections and multiple connection interfaces. Advantageously, the exemplary chip intra-bonding techniques disclosed herein provide direct chip-to-chip connections in overlapping, intra-bonded regions of adjacent IC chips without the need to route chip-to-chip I/O connection through the underlying package substrate. For example, in some embodiments, the exemplary chip intra-bonding techniques disclosed herein provide direct chip-to-chip connections between the BEOL layers of two adjacent IC chips, resulting in significantly short, low resistance and low capacitance I/O connections between the intra-boned IC chips.

Although exemplary embodiments have been described herein with reference to the accompanying figures, it is to be understood that the disclosure is not limited to those precise embodiments, and that various other changes and modifications may be made therein by one skilled in the art without departing from the scope of the appended claims.

What is claimed is:

1. A device, comprising:

a first semiconductor die comprising a first overlap region which comprises a first array of metallic contacts; and a second semiconductor die comprising a second overlap region which comprises a second array of metallic contacts;

wherein the first overlap region of the first semiconductor die is defined by an etched region on one side of the first semiconductor die; and wherein the first overlap region and the second overlap region are overlapped and bonded together with the first array of metallic contacts aligned to the second array of metallic contacts, and with the first semiconductor die and the second semiconductor die disposed laterally adjacent to each other.

2. The device of claim 1, wherein:

the first array of metallic contacts comprises a first array of copper posts disposed in a first insulating layer; and the second array of metallic contacts comprises a second array of copper posts disposed in a second insulating layer.

3. The device of claim 2, wherein the first overlap region and the second overlap region are bonded together by at least one of: thermal compression bonding of the first array of copper posts and the second array of copper posts; and covalent bonding of the first insulating layer and the second insulating layer.

4. The device of claim 1, wherein the second overlap region of the second semiconductor die is defined by an etched region on one side of the second semiconductor die.

5. The device of claim 1, wherein the first overlap region has a first footprint and the second overlap region has a second footprint which is substantially a same size as the first footprint.

6. The device of claim 1, wherein the first overlap region has a first footprint and the second overlap region has a second footprint which is smaller than the first footprint.

7. The device of claim 1, wherein:

the first array of metallic contacts are disposed in a first level of a first back-end-of-line structure of the first semiconductor die; and the second array of metallic contacts are disposed in a first level of a second back-end-of-line structure of the second semiconductor die.

8. The device of claim 1, wherein the first array of metallic contacts and second array of metallic contacts are bonded together to form an array of die-to-die interconnects that enable input/output communication between the first semiconductor die and the second semiconductor die.

9. The device of claim 1, wherein at least one of the first overlap region of the first semiconductor die and the second overlap region of the second semiconductor die comprises one or more structural alignment features which facilitate lateral self-alignment of the first overlap region and the second overlap region when the first overlap region and the second overlap region are overlapped and bonded together.

10. The device of claim 9, wherein the one or more structural alignment features comprises a tongue structure formed in the first overlap region and a notch structure formed in the second overlap region, wherein the tongue structure is placed into the notch structure to achieve lateral self-alignment of the first overlap region and the second overlap region.

11. The device of claim 1, wherein:

the first semiconductor die comprises a first surface;

the second semiconductor die comprises a second surface; and the first surface and the second surface are coplanar with the first and second semiconductor dies disposed laterally adjacent to each other.

12. A device, comprising:

a first semiconductor die comprising a first overlap region which comprises a first array of metallic contacts; and a second semiconductor die comprising a second array of metallic contacts;

wherein the first overlap region of the first semiconductor die is defined by an etched region on one side of the first semiconductor die; and wherein the second semiconductor die is bonded to the first overlap region of the first semiconductor die with the second array of metallic contacts aligned to at least a portion of the first array of metallic contacts, and with the first semiconductor die and the second semiconductor die disposed laterally adjacent to each other.

13. The device of claim 12, further comprising a third semiconductor die comprising a third array of metallic contacts, wherein the third semiconductor die is bonded to the first overlap region of the first semiconductor die with the third array of metallic contacts aligned to at least a portion of the first array of metallic contacts, and with the first semiconductor die, the second semiconductor die, and the third semiconductor die disposed laterally adjacent to each other.

14. The device of claim 12, wherein:

the first semiconductor die comprises a second overlap region which comprises a second array of metallic contacts;

the device further comprises a third semiconductor die comprising a third array of metallic contacts; and the third semiconductor die is bonded to the second overlap region of the first semiconductor die with the third array of metallic contacts aligned to at least a portion of the second array of metallic contacts, and with the first semiconductor die, the second semiconductor die, and the third semiconductor die disposed laterally adjacent to each other.

15. The device of claim 12, wherein:

the first semiconductor die comprises a first surface;

the second semiconductor die comprises a second surface; and the first surface and the second surface are coplanar with the first and second semiconductor dies disposed laterally adjacent to each other.

16. A device, comprising:

a first semiconductor die comprising a first overlap region which comprises a first array of metallic contacts; and a second semiconductor die comprising a second overlap region which comprises a second array of metallic contacts; wherein:

the first overlap region of the first semiconductor die is defined by an etched region of a backside of the first semiconductor die;

the second overlap region of the second semiconductor die is defined by an etched region of a frontside of the second semiconductor die; and the first overlap region and the second overlap region are overlapped and bonded together with the first array of metallic contacts aligned to the second array of metallic contacts, and with the first semiconductor die and the second semiconductor die disposed laterally adjacent to each other.

17. The device of claim 16, wherein:

the first array of metallic contacts comprises a first array of copper posts disposed in a first insulating layer; and the second array of metallic contacts comprises a second array of copper posts disposed in a second insulating layer.

18. The device of claim 17, wherein the first overlap region and the second overlap region are bonded together by at least one of: thermal compression bonding of the first array of copper posts and the second array of copper posts; and covalent bonding of the first insulating layer and the second insulating layer.

19. The device of claim 16, wherein the first overlap region has a first footprint and the second overlap region has a second footprint which is substantially a same size as the first footprint.

20. The device of claim 16, wherein the first overlap region has a first footprint and the second overlap region has a second footprint which is smaller than the first footprint.

21. The device of claim 16, wherein:

the first array of metallic contacts are disposed in a first level of a first back-end-of-line structure of the first semiconductor die; and the second array of metallic contacts are disposed in a first level of a second back-end-of-line structure of the second semiconductor die.

22. The device of claim 16, wherein the first array of metallic contacts and second array of metallic contacts are bonded together to form an array of die-to-die interconnects that enable input/output communication between the first semiconductor die and the second semiconductor die.

23. The device of claim 16, wherein at least one of the first overlap region of the first semiconductor die and the second overlap region of the second semiconductor die comprises one or more structural alignment features which facilitate lateral self-alignment of the first overlap region and the second overlap region when the first overlap region and the second overlap region are overlapped and bonded together.

24. The device of claim 23, wherein the one or more structural alignment features comprises a tongue structure formed in the first overlap region and a notch structure formed in the second overlap region, wherein the tongue structure is placed into the notch structure to achieve lateral self-alignment of the first overlap region and the second overlap region.

25. A device, comprising:

a first semiconductor die comprising a first overlap region which comprises a first array of metallic contacts; and a second semiconductor die comprising a second overlap region which comprises a second array of metallic contacts;

wherein the first overlap region and the second overlap region are overlapped and bonded together with the first array of metallic contacts aligned to the second array of metallic contacts, and with the first semiconductor die and the second semiconductor die disposed laterally adjacent to each other with a first surface of the first semiconductor die being coplanar with a second surface of the second semiconductor die.

* * * * *